(12) United States Patent
Dunn et al.

(10) Patent No.: US 12,436,422 B2
(45) Date of Patent: Oct. 7, 2025

(54) DISPLAY ASSEMBLY USING STRUCTURAL ADHESIVE

(71) Applicant: Manufacturing Resources International, Inc., Alpharetta, GA (US)

(72) Inventors: William Dunn, Alpharetta, GA (US); Marcos Diaz, Alpharetta, GA (US); Tim Hubbard, Alpharetta, GA (US); Matt Dosch, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 18/970,066

(22) Filed: Dec. 5, 2024

(65) Prior Publication Data
US 2025/0093696 A1 Mar. 20, 2025

Related U.S. Application Data

(62) Division of application No. 17/669,439, filed on Feb. 11, 2022, now Pat. No. 12,197,060.

(60) Provisional application No. 63/148,703, filed on Feb. 12, 2021.

(51) Int. Cl.
*G02F 1/1333* (2006.01)
*H05K 7/20* (2006.01)

(52) U.S. Cl.
CPC .. *G02F 1/133385* (2013.01); *G02F 1/133308* (2013.01); *H05K 7/202* (2013.01); *G02F 2202/28* (2013.01)

(58) Field of Classification Search
None
See application file for complete search history.

(56) References Cited

U.S. PATENT DOCUMENTS

| | | | |
|---|---|---|---|
| 2,553,961 | A | 5/1951 | Dreyer |
| 2,907,102 | A | 10/1959 | Armstrong et al. |
| 2,986,379 | A | 5/1961 | Kramig, Jr. |
| 3,784,586 | A | 1/1974 | Thomas et al. |
| 3,823,794 | A | 7/1974 | Bre |

(Continued)

FOREIGN PATENT DOCUMENTS

| | | |
|---|---|---|
| AU | 2003242399 B2 | 11/2003 |
| AU | 2003285975 A1 | 6/2004 |

(Continued)

OTHER PUBLICATIONS

Dave Roos, How Transmissive Film Works, 2008, 9 Pages.

(Continued)

*Primary Examiner* — Richard H Kim
(74) *Attorney, Agent, or Firm* — Standley Law Group LLP; Jeffrey S. Standley; Adam J. Smith

(57) ABSTRACT

A display assembly is provided which includes a housing for an electronic display and a thermal management substructure. The thermal management substructure is located rearward of the electronic display and includes multiple components, which are secured to one another by a plurality of deposits of structural adhesive. Methods of manufacturing the thermal management substructure are also provided where structural adhesive is deposited between components of the thermal management substructure.

17 Claims, 18 Drawing Sheets

(56) References Cited

U.S. PATENT DOCUMENTS

| | | | |
|---|---|---|---|
| 3,858,965 | A | 1/1975 | Sumita |
| 4,007,552 | A | 2/1977 | Brooks |
| 4,093,355 | A | 6/1978 | Kaplit et al. |
| 4,297,401 | A | 10/1981 | Chern et al. |
| 4,299,639 | A | 11/1981 | Bayer |
| 4,593,978 | A | 6/1986 | Mourey et al. |
| 4,604,444 | A | 8/1986 | Donnadieu et al. |
| 4,634,225 | A | 1/1987 | Haim et al. |
| 4,640,584 | A | 2/1987 | Tsuboyama et al. |
| 4,691,995 | A | 9/1987 | Yamazaki et al. |
| 4,712,875 | A | 12/1987 | Tsuboyama et al. |
| 4,715,686 | A | 12/1987 | Iwashita et al. |
| 4,724,023 | A | 2/1988 | Marriott |
| 4,766,176 | A | 8/1988 | Lee et al. |
| 4,896,218 | A | 1/1990 | Vick |
| 4,950,344 | A | 8/1990 | Glover et al. |
| 5,029,982 | A | 7/1991 | Nash |
| 5,059,484 | A | 10/1991 | Clark et al. |
| 5,066,699 | A | 11/1991 | Lee et al. |
| 5,074,092 | A | 12/1991 | Norlander |
| 5,088,806 | A | 2/1992 | McCartney et al. |
| 5,148,591 | A | 9/1992 | Pryor |
| 5,247,374 | A | 9/1993 | Terada |
| 5,330,262 | A | 7/1994 | Peters |
| 5,365,354 | A | 11/1994 | Jannson et al. |
| 5,379,139 | A | 1/1995 | Sato et al. |
| 5,402,141 | A | 3/1995 | Haim et al. |
| 5,406,399 | A | 4/1995 | Koike |
| 5,547,483 | A | 8/1996 | Garcia et al. |
| 5,548,038 | A | 8/1996 | Enami et al. |
| 5,559,614 | A | 9/1996 | Urbish et al. |
| 5,601,915 | A | 2/1997 | Ochi et al. |
| 5,606,438 | A | 2/1997 | Margalit et al. |
| 5,610,742 | A | 3/1997 | Hinata et al. |
| 5,656,824 | A | 8/1997 | den Boer et al. |
| 5,661,210 | A | 8/1997 | Burns et al. |
| 5,748,269 | A | 5/1998 | Harris et al. |
| 5,767,489 | A | 6/1998 | Ferrier |
| 5,818,010 | A | 10/1998 | McCann |
| 5,823,031 | A | 10/1998 | Campbell et al. |
| 5,838,405 | A | 11/1998 | Izumi et al. |
| 5,852,484 | A | 12/1998 | Inoue et al. |
| 5,869,919 | A | 2/1999 | Sato et al. |
| 5,899,027 | A | 5/1999 | St. Louis |
| 5,911,899 | A | 6/1999 | Yoshikai et al. |
| 5,937,611 | A | 8/1999 | Howes |
| 5,991,153 | A | 11/1999 | Heady et al. |
| 6,020,945 | A | 2/2000 | Sawai et al. |
| 6,074,741 | A | 6/2000 | Murata et al. |
| 6,089,751 | A | 7/2000 | Conover et al. |
| 6,099,672 | A | 8/2000 | Yamazaki et al. |
| 6,157,432 | A | 12/2000 | Helbing |
| 6,191,839 | B1 | 2/2001 | Briley et al. |
| 6,198,515 | B1 | 3/2001 | Cole |
| 6,211,934 | B1 | 4/2001 | Habing et al. |
| 6,219,127 | B1 | 4/2001 | Hirakata et al. |
| 6,359,390 | B1 | 3/2002 | Nagai |
| 6,392,727 | B1 | 5/2002 | Larson et al. |
| 6,398,371 | B1 | 6/2002 | Matsunaga et al. |
| 6,417,900 | B1 | 7/2002 | Shin et al. |
| 6,421,103 | B2 | 7/2002 | Yamaguchi |
| 6,437,673 | B1 | 8/2002 | Nishida et al. |
| 6,446,467 | B1 | 9/2002 | Lieberman et al. |
| 6,451,870 | B1 | 9/2002 | DeCato et al. |
| 6,465,092 | B1 | 10/2002 | Takushima et al. |
| 6,472,032 | B1 | 10/2002 | Asano |
| 6,504,713 | B1 | 1/2003 | Pandolfi et al. |
| 6,512,562 | B1 | 1/2003 | Kobayashi et al. |
| 6,535,266 | B1 | 3/2003 | Nemeth et al. |
| 6,555,235 | B1 | 4/2003 | Aufderheide et al. |
| 6,611,302 | B1 | 8/2003 | Ueda et al. |
| 6,628,355 | B1 | 9/2003 | Takahara |
| 6,650,393 | B1 | 11/2003 | Nishiguchi |
| 6,683,639 | B2 | 1/2004 | Driessen-Olde Scheper et al. |
| 6,692,986 | B1 | 2/2004 | Bayer et al. |
| 6,727,468 | B1 | 4/2004 | Nemeth |
| 6,731,357 | B1 | 5/2004 | Tachibana et al. |
| 6,731,367 | B1 | 5/2004 | Saitoh |
| 6,747,720 | B2 | 6/2004 | Saiki et al. |
| 6,762,471 | B2 | 7/2004 | Kim |
| 6,779,252 | B2 | 8/2004 | Tracy et al. |
| 6,818,721 | B2 | 11/2004 | Zha et al. |
| 6,825,899 | B2 | 11/2004 | Kobayashi |
| 6,830,348 | B2 | 12/2004 | Nakamura et al. |
| 6,839,104 | B2 | 1/2005 | Taniguchi et al. |
| 6,873,387 | B2 | 3/2005 | Hokazono et al. |
| 6,885,412 | B2 | 4/2005 | Ohnishi et al. |
| 6,909,486 | B2 | 6/2005 | Wang et al. |
| 6,943,768 | B2 | 9/2005 | Cavanaugh et al. |
| 6,955,833 | B1 | 10/2005 | Gallego |
| 6,961,108 | B2 | 11/2005 | Wang et al. |
| 7,052,152 | B2 | 5/2006 | Harbers et al. |
| 7,059,757 | B2 | 6/2006 | Shimizu |
| 7,083,285 | B2 | 8/2006 | Hsu et al. |
| 7,131,313 | B2 | 11/2006 | Nakazato |
| 7,161,642 | B2 | 1/2007 | Kim et al. |
| 7,194,158 | B2 | 3/2007 | Schultheis et al. |
| 7,218,812 | B2 | 5/2007 | Maxwell et al. |
| 7,230,659 | B2 | 6/2007 | Ha et al. |
| 7,232,250 | B2 | 6/2007 | Chuang |
| 7,283,185 | B2 | 10/2007 | Hirakata et al. |
| 7,295,179 | B2 | 11/2007 | Dunn |
| 7,481,553 | B2 | 1/2009 | Kim et al. |
| 7,481,566 | B2 | 1/2009 | Han |
| 7,633,583 | B2 | 12/2009 | Wang et al. |
| 7,798,694 | B2 | 9/2010 | Hwang |
| 7,811,640 | B2 | 10/2010 | Charters et al. |
| 7,812,919 | B2 | 10/2010 | Chien et al. |
| 7,922,381 | B2 | 4/2011 | Han et al. |
| 7,923,071 | B2 | 4/2011 | Charters et al. |
| 7,924,362 | B2 | 4/2011 | Slobodin |
| 8,004,648 | B2 | 8/2011 | Dunn |
| 8,009,262 | B2 | 8/2011 | Dunn |
| 8,021,900 | B2 | 9/2011 | Maxwell et al. |
| 8,120,595 | B2 | 2/2012 | Kukulj et al. |
| 8,208,115 | B2 | 6/2012 | Dunn |
| 8,242,974 | B2 | 8/2012 | Yamazaki et al. |
| 8,269,916 | B2 | 9/2012 | Ohkawa |
| 8,274,626 | B2 | 9/2012 | Choi et al. |
| 8,294,168 | B2 | 10/2012 | Park et al. |
| 8,529,993 | B2 | 9/2013 | Charters et al. |
| 8,562,770 | B2 | 10/2013 | Dunn et al. |
| 8,674,390 | B2 | 3/2014 | Harris et al. |
| 8,674,963 | B2 | 3/2014 | Cornish et al. |
| 8,711,321 | B2 | 4/2014 | Dunn et al. |
| 8,827,472 | B2 | 9/2014 | Takada |
| 8,879,042 | B2 | 11/2014 | Dunn |
| 9,317,060 | B2 | 4/2016 | Dunn et al. |
| 9,573,346 | B2 | 2/2017 | Dunn et al. |
| 9,756,739 | B2 | 9/2017 | Russell-Clarke et al. |
| 9,950,500 | B2 | 4/2018 | Dunn et al. |
| 10,730,269 | B2 | 8/2020 | Dunn et al. |
| 11,591,261 | B2 | 2/2023 | Dunn et al. |
| 11,668,695 | B1 | 6/2023 | Bolton |
| 12,055,809 | B2 | 8/2024 | Dunn et al. |
| 12,071,372 | B2 | 8/2024 | Dunn et al. |
| 2001/0001459 | A1 | 5/2001 | Savant et al. |
| 2001/0019454 | A1 | 9/2001 | Tadic-Galeb et al. |
| 2001/0043293 | A1 | 11/2001 | Inoue |
| 2002/0033919 | A1 | 3/2002 | Sanelle et al. |
| 2002/0042162 | A1 | 4/2002 | Tone et al. |
| 2002/0101553 | A1 | 8/2002 | Enomoto et al. |
| 2002/0126248 | A1 | 9/2002 | Yoshida |
| 2002/0149714 | A1 | 10/2002 | Anderson et al. |
| 2002/0186333 | A1 | 12/2002 | Ha et al. |
| 2002/0187575 | A1 | 12/2002 | Maruyama et al. |
| 2003/0007109 | A1 | 1/2003 | Park |
| 2003/0026085 | A1 | 2/2003 | Ueda et al. |
| 2003/0090810 | A1 | 5/2003 | Detro et al. |
| 2003/0174455 | A1* | 9/2003 | Kataria ............ H01L 23/3737 361/103 |
| 2004/0018375 | A1 | 1/2004 | Banno et al. |
| 2004/0032638 | A1 | 2/2004 | Tonar et al. |
| 2004/0036834 | A1 | 2/2004 | Ohnishi et al. |

(56) References Cited

U.S. PATENT DOCUMENTS

| | | |
|---|---|---|
| 2004/0062029 A1 | 4/2004 | Ato |
| 2004/0105159 A1 | 6/2004 | Saccomanno et al. |
| 2004/0113044 A1 | 6/2004 | Ishiguchi |
| 2004/0145805 A1 | 7/2004 | Qiu |
| 2004/0155997 A1 | 8/2004 | West et al. |
| 2004/0165139 A1 | 8/2004 | Anderson et al. |
| 2004/0239823 A1 | 12/2004 | Silsby et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073640 A1 | 4/2005 | Dunn et al. |
| 2005/0105178 A1 | 5/2005 | Kim |
| 2005/0115670 A1 | 6/2005 | Bettinelli et al. |
| 2005/0117110 A1 | 6/2005 | Byun et al. |
| 2005/0134526 A1 | 6/2005 | Willem et al. |
| 2005/0212990 A1 | 9/2005 | Robinder |
| 2005/0286131 A1 | 12/2005 | Saxena et al. |
| 2006/0082271 A1 | 4/2006 | Lee et al. |
| 2006/0082700 A1 | 4/2006 | Gehlsen et al. |
| 2006/0092348 A1 | 5/2006 | Park |
| 2006/0103299 A1 | 5/2006 | Kwok et al. |
| 2006/0132699 A1 | 6/2006 | Cho et al. |
| 2006/0159867 A1 | 7/2006 | O'Donnell |
| 2006/0209266 A1 | 9/2006 | Utsunomiya |
| 2006/0262258 A1 | 11/2006 | Wang et al. |
| 2006/0274237 A1 | 12/2006 | Nelson et al. |
| 2006/0279946 A1 | 12/2006 | Park et al. |
| 2006/0289201 A1 | 12/2006 | Kim et al. |
| 2007/0065091 A1 | 3/2007 | Hinata et al. |
| 2007/0103854 A1 | 5/2007 | Yu et al. |
| 2007/0139574 A1 | 6/2007 | Ko et al. |
| 2007/0151664 A1 | 7/2007 | Shin |
| 2007/0200095 A1 | 8/2007 | Murazaki |
| 2007/0206158 A1 | 9/2007 | Kinoshita et al. |
| 2007/0230218 A1 | 10/2007 | Jachim et al. |
| 2007/0267174 A1 | 11/2007 | Kim |
| 2007/0268201 A1 | 11/2007 | Sampsell et al. |
| 2007/0279556 A1 | 12/2007 | Wang et al. |
| 2008/0049164 A1 | 2/2008 | Jeon et al. |
| 2008/0083906 A1 | 4/2008 | Takahara et al. |
| 2008/0111949 A1 | 5/2008 | Shibata et al. |
| 2008/0111958 A1 | 5/2008 | Kleverman et al. |
| 2008/0146709 A1 | 6/2008 | Aketa et al. |
| 2008/0151082 A1 | 6/2008 | Chan |
| 2008/0176345 A1 | 7/2008 | Yu et al. |
| 2008/0230177 A1 | 9/2008 | Crouser et al. |
| 2008/0261057 A1 | 10/2008 | Slobodin |
| 2008/0284942 A1 | 11/2008 | Mahama et al. |
| 2009/0015747 A1 | 1/2009 | Nishizawa et al. |
| 2009/0015761 A1 | 1/2009 | Stockham |
| 2009/0021915 A1 | 1/2009 | Kuo |
| 2009/0088547 A1 | 4/2009 | Schamschurin et al. |
| 2009/0104989 A1 | 4/2009 | Williams et al. |
| 2009/0153780 A1 | 6/2009 | Takata |
| 2009/0251650 A1 | 10/2009 | Fukagawa et al. |
| 2010/0039696 A1 | 2/2010 | de Groot et al. |
| 2010/0043966 A1 | 2/2010 | Dunn et al. |
| 2010/0098839 A1 | 4/2010 | Toyoda et al. |
| 2010/0253660 A1 | 10/2010 | Hashimoto |
| 2010/0302777 A1 | 12/2010 | Knoll et al. |
| 2010/0307800 A1 | 12/2010 | Wee et al. |
| 2011/0019363 A1 | 1/2011 | Vahlsing et al. |
| 2011/0090630 A1 | 4/2011 | Bergeron et al. |
| 2011/0151197 A1 | 6/2011 | Charters et al. |
| 2011/0194053 A1 | 8/2011 | Tannas |
| 2011/0205472 A1 | 8/2011 | Kobayashi et al. |
| 2011/0221995 A1 | 9/2011 | Park |
| 2012/0038849 A1 | 2/2012 | Dunn et al. |
| 2012/0050958 A1 | 3/2012 | Sanford et al. |
| 2012/0069273 A1 | 3/2012 | Watanabe |
| 2012/0111479 A1 | 5/2012 | Sung et al. |
| 2012/0154712 A1 | 6/2012 | Yu et al. |
| 2012/0242926 A1 | 9/2012 | Hsu et al. |
| 2012/0275023 A1 | 11/2012 | Weber et al. |
| 2012/0287368 A1 | 11/2012 | Que et al. |
| 2012/0295051 A1 | 11/2012 | Dunn et al. |
| 2013/0027633 A1 | 1/2013 | Park et al. |
| 2013/0051200 A1 | 2/2013 | Oshio |
| 2013/0094160 A1 | 4/2013 | Narumi |
| 2013/0163277 A1 | 6/2013 | Kim et al. |
| 2013/0206063 A1 | 8/2013 | Van Rensburg et al. |
| 2013/0329363 A1 | 12/2013 | Dunn et al. |
| 2014/0118221 A1 | 5/2014 | Park et al. |
| 2014/0268657 A1 | 9/2014 | Dunn et al. |
| 2014/0285732 A1 | 9/2014 | Tanabe et al. |
| 2014/0321103 A1 | 10/2014 | Dunn et al. |
| 2015/0177480 A1 | 6/2015 | Bullock et al. |
| 2015/0328671 A1 | 11/2015 | Ilinich et al. |
| 2016/0037657 A1 | 2/2016 | Yoshizumi |
| 2017/0081565 A1 | 3/2017 | Chatterjee et al. |
| 2017/0210668 A1 | 7/2017 | Dunn et al. |
| 2017/0242290 A1 | 8/2017 | Jenkins et al. |
| 2018/0086954 A1 | 3/2018 | Morioka et al. |
| 2018/0200999 A1 | 7/2018 | Dunn et al. |
| 2018/0366685 A1 | 12/2018 | Park et al. |
| 2020/0285099 A1 | 9/2020 | Wang et al. |
| 2020/0393612 A1 * | 12/2020 | Ma .................. G02F 1/1336 |
| 2021/0046746 A1 | 2/2021 | Xie |
| 2022/0161309 A1 | 5/2022 | Gambino |
| 2022/0260872 A1 | 8/2022 | Dunn et al. |
| 2023/0002558 A1 | 1/2023 | Hedge et al. |
| 2023/0159387 A1 | 5/2023 | Dunn et al. |
| 2023/0418101 A1 | 12/2023 | Dunn et al. |

FOREIGN PATENT DOCUMENTS

| | | |
|---|---|---|
| AU | 2006214795 A1 | 8/2007 |
| CN | 1720282 A | 1/2006 |
| CN | 101142532 A | 3/2008 |
| CN | 101541863 A | 9/2009 |
| CN | 102202860 A | 9/2011 |
| CN | 202815379 U | 3/2013 |
| EP | 1576033 A1 | 9/2005 |
| EP | 1640337 A2 | 3/2006 |
| EP | 1678534 A1 | 7/2006 |
| EP | 1851591 A1 | 11/2007 |
| EP | 1923406 A1 | 5/2008 |
| EP | 4291826 A1 | 12/2023 |
| GB | 2402205 A | 12/2004 |
| JP | 62197335 A | 9/1987 |
| JP | 3153212 A | 7/1991 |
| JP | 8194437 A | 7/1996 |
| JP | H08271883 A | 10/1996 |
| JP | 11160727 A | 6/1999 |
| JP | 2002158475 A | 5/2002 |
| JP | 2004205599 A | 7/2004 |
| JP | 2005029579 A | 2/2005 |
| JP | 2005055641 A | 3/2005 |
| JP | 2005121940 A | 5/2005 |
| JP | 2005134849 A | 5/2005 |
| JP | 2005225793 A | 8/2005 |
| JP | 2006508216 A | 9/2006 |
| JP | 2008530317 A | 8/2008 |
| JP | 2008292743 A | 12/2008 |
| JP | 2010506982 A | 3/2010 |
| JP | 2013080242 A | 5/2013 |
| KR | 20040097466 A | 11/2004 |
| KR | 20050084086 A | 8/2005 |
| KR | 1020060016469 A | 2/2006 |
| KR | 100666961 B1 | 1/2007 |
| KR | 1020070070675 A | 7/2007 |
| KR | 1020070103069 A | 10/2007 |
| KR | 20080046335 A | 5/2008 |
| KR | 20080086245 A | 9/2008 |
| KR | 1020090064588 A | 6/2009 |
| MY | PI20071284 | 2/2009 |
| TW | 200702904 A | 1/2007 |
| TW | 200809287 A | 2/2008 |
| TW | 200838901 A | 10/2008 |
| TW | 201114716 A | 5/2011 |
| WO | WO2004036270 A1 | 4/2004 |
| WO | WO2005079129 A1 | 8/2005 |
| WO | WO2011049564 A1 | 4/2011 |

(56) References Cited

FOREIGN PATENT DOCUMENTS

| WO | WO2012073929 A1 | 6/2012 |
|----|-----------------|--------|
| WO | WO2014149502 A1 | 9/2014 |
| WO | WO2022174006 A1 | 8/2022 |

OTHER PUBLICATIONS

Cytec, Uvekol S UV Curable Glass Laminating System, May 4, 2006, 1 Page.
Schott, Glass Made of Ideas: Opalika, 2 Pages.
Pilkington Building Products, Pilkington OptiView Anti-Reflective Glass, 2005, 2 Pages.
T.M. Zeef, T.H. Hubing, J.L. Drewniak, R.E. Dussroff & T.P. Van Doren, Emc Analysis of an 18" LCD Monitor, Aug. 21-25, 2000, 1 Page.
3M Optical Systems, Immerse Yourself in Color, 2013, 4 Pages.
Wikipedia, Sol-gel, 2016, 12 Pages.
Panel-Brite, Inc., AOT (Advanced Optibond Technology), Mar. 11, 2009, 1 Page.
Dow Corning Corporation, Information About High Technology Silicone Materials, 1992, 4 Pages.
Dow Corning Corporation, Material Safety Data Sheet, Mar. 29, 2011, 8 Pages.
Pilkington Building & Speciality Glass Products, Pilkington TEC Glass For the Refrigeration Market, 2002, 2 Pages.
Mentley, David E., State of Flat-Panel Display Technology and Future Trends, Proceedings of the IEEE, Apr. 2002, vol. 90, No. 4, pp. 453-459.

\* cited by examiner

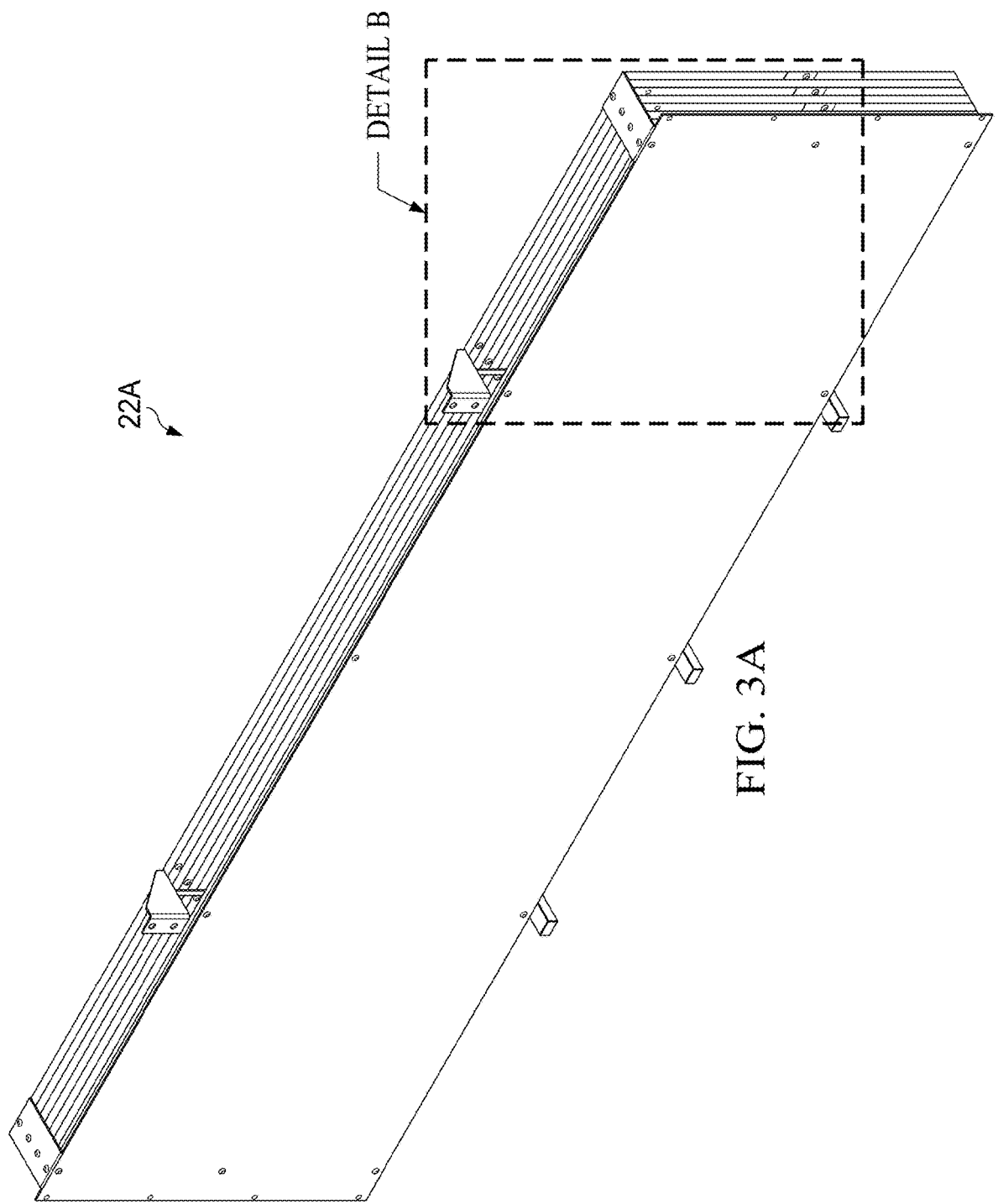

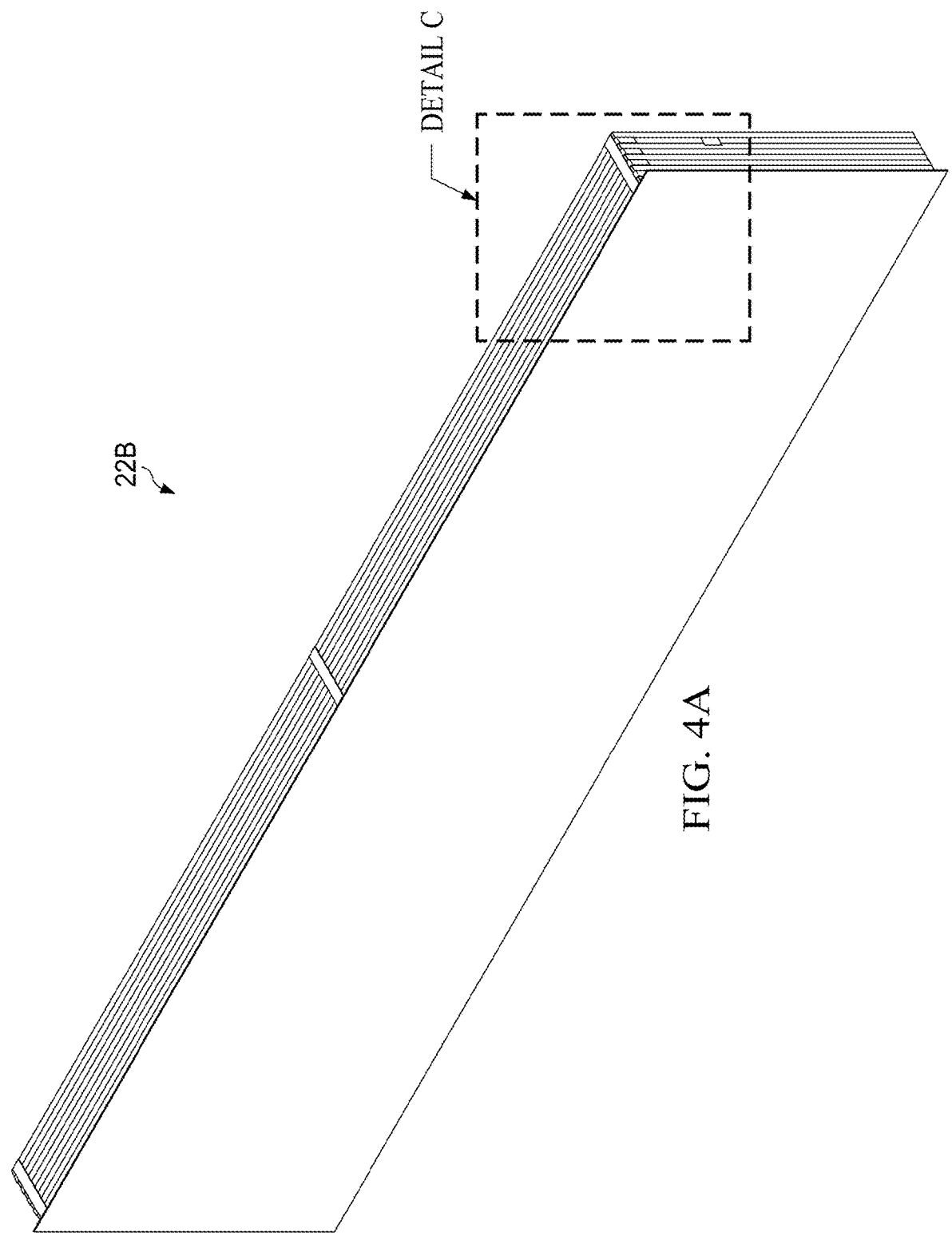

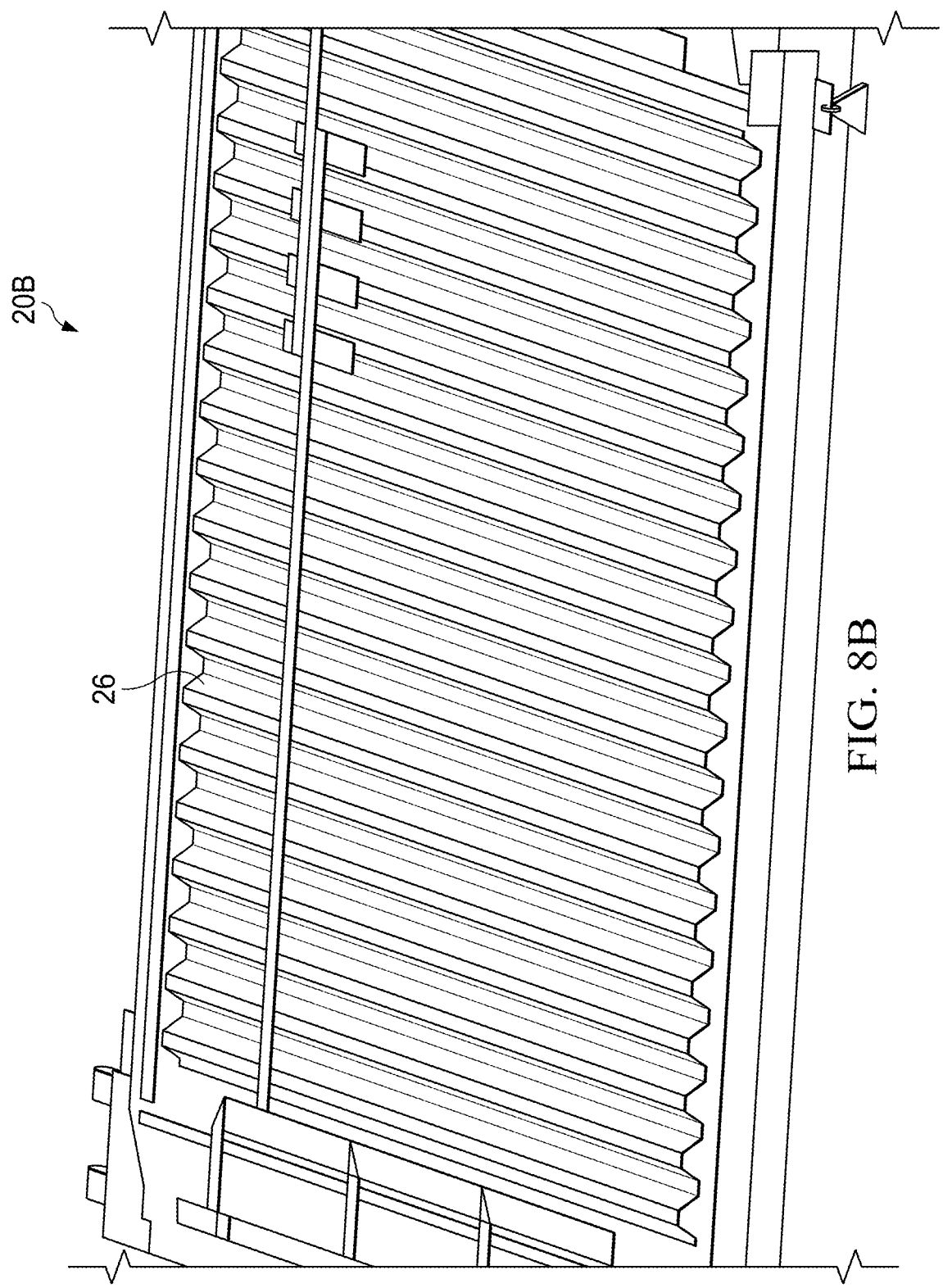

DISPLAY ASSEMBLY USING STRUCTURAL ADHESIVE

CROSS-REFERENCE TO RELATED APPLICATIONS

This application is a divisional of U.S. application Ser. No. 17/669,439 filed Feb. 11, 2022, which claims the benefit of U.S. Provisional Application Ser. No. 63/148,703 filed Feb. 12, 2021, the disclosures of which are hereby incorporated by reference as if fully rested herein.

TECHNICAL FIELD

Exemplary embodiments relate generally to display assemblies using structural adhesive and methods of manufacture related to the same.

BACKGROUND AND SUMMARY OF THE INVENTION

The use of electronic displays, such as for advertising, in the out-of-home market has increased in popularity over recent years. Being located outdoors, such electronic displays are frequently exposed to harsh conditions, including, but not limited to, solar loading, extreme temperatures, precipitation, moisture, contaminants, vandalism, wildlife, and the like. To protect the electronic displays and other associated sensitive components from such harsh conditions, it is known to place the electronic displays in ruggedized housings. Such housings may fully or partially seal the electronic displays and other associated sensitive components.

Fasteners are typically used to attach components of, or associated with, such ruggedized housings. The use of fasteners introduces potential leak points and requires additional parts and manufacturing time. Sometimes, welding is used to join components, but welding is not available for all types of material and can be time and labor intensive to use. Furthermore, welding can introduce distortion which can affect optical quality of displayed images.

Display assemblies which comprise structural adhesive, and methods of manufacture related to the same, are provided. In exemplary embodiments, the structural adhesive is used in place of at least some of the fasteners. The use of such structural adhesive may provide a number of benefits, at least some of which are unexpected. For example, without limitation, use of the structural adhesive, particularly in place of fasteners, may provide flatter surfaces. Especially in the case of components attached, directly or indirect to, the electronic display layer, any diffusion panels, cover panels, films, filters, and the like, such flatter surfaces may improve optics and/or may provide better sealing between subassemblies and/or components. As another example, again without limitation, the use of such structural adhesive may provide for a stiffer and/or stronger assembly. This may improve longevity and/or reduced vibrations. As yet another example, without limitation, the use of such structural adhesive may improve dimensional accuracy, resulting in better thermal conduction and/or the ability to add extra components. Display assemblies using such structural adhesive may enjoy reduced noise emission and reduced power consumption (e.g., by reducing thermal management needs and/or improving airflow) to name a few examples. The use of such structural adhesive may also reduce the number of parts required, manufacturing time, manufacturing costs, combinations thereof, or the like. Furthermore, the use of structural adhesive in place of fasteners may reduce potential leak points.

The same of different structural adhesive may be used at various locations of the display assembly. For example, the structural adhesive may be used to manufacture specific components, join specific parts, combinations thereof, or the like. In exemplary embodiments, the structural adhesive comprises methyl methacrylate (hereinafter also "MMA"), though any type or kind of adhesive may be utilized. The structural adhesive may comprise a spacing material, such as, but not limited to, glass beads in exemplary embodiments. The spacing material may ensure that a desired amount of structural adhesive remains between two compressed parts and may provide for consistent tolerancing.

In exemplary embodiments, without limitation, the structural adhesive may be used to manufacture a thermal management substructure for the display assembly. The thermal management substructure may comprise one or more heat exchangers, at least some of which may comprise multiple layers. In exemplary embodiments, the thermal management substructure comprises a first heat exchange substructure. The first heat exchange substructure may comprise a single or multiple layer heat exchanger. The first heat exchange substructure may be configured to accommodate ambient air in exemplary embodiments, without limitation. The first heat exchange substructure may form part of an open loop airflow pathway for ambient air when secured within the display assembly by way of non-limiting example. For example, without limitation, the structural adhesive may be applied along ridges and/or troughs of a corrugated layer of the first heat exchange substructure to secure the corrugated layer to front and/or rear panels of the first heat exchange substructure. The first heat exchange substructure may, in exemplary embodiments, without limitation, be provided, directly or indirectly, along a rear surface of a backlight for an electronic display layer and may be configured, at least in part, to remove heat generated by the backlight.

Alternatively, or additionally, the thermal management substructure may comprise a second heat exchange substructure. The second heat exchange substructure may comprise a multi-layer heat exchanger. The second heat exchange substructure may be configured to accommodate both ambient air and circulating gas in exemplary embodiments, without limitation. The second heat exchange substructure may be configured to form part of an open loop airflow pathway for ambient air and a closed loop airflow pathway for circulating gas when installed within the display assembly, by way of non-limiting example. The structural adhesive may be applied at the second heat exchange substructure, such as to form the same. The second heat exchange substructure may comprise multiple layers. For example, without limitation, the structural adhesive may be applied between one or more layers of the second heat exchange substructure, such as, but not limited to, at the layers themselves, at spacing members, and/or at connecting members extending between the layers, to secure such layers to each other, to a front and/or rear panel, and/or to other components of the assembly. The second heat exchange substructure may, in exemplary embodiments, be provided rearward of the first heat exchange substructure. The second heat exchange substructure may form part of an open loop airflow pathway for ambient air and part of a closed loop airflow pathway for circulating gas. The second heat exchange substructure may be configured to move heat from the circulating gas to the ambient air.

The ambient air within the open loop airflow pathway may be entirely or substantially prevented from mixing with the circulating gas of the closed loop airflow pathway. For example, without limitation, the display assembly may be configured to comply with various ingress protection standards, such as, but not limited to, IP 65, IP 66, IP 67, IP 68, combinations thereof, or the like.

For example, without limitation, in the case of a display assembly for an 86" display, the use of such structural adhesive may replace as many as 300 fasteners, if not more. Some or all components of the display assembly may be devoid of fasteners, by way of non-limiting example.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 3A is a perspective view of a second heat exchange substructure using fasteners for use with the display assembly of FIG. 1 indicating detail B;

FIG. 4A is a perspective view of an exemplary second heat exchange substructure using structural adhesive for use with the display assembly of FIG. 1 and indicating detail C;

FIG. 8B is a cross sectional perspective view taken along section line C-C of FIG. 5B;

DETAILED DESCRIPTION OF EXEMPLARY EMBODIMENT(S)

Various embodiments of the present invention will now be described in detail with reference to the accompanying drawings. In the following description, specific details, such as detailed configuration and components, are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Figure 1:
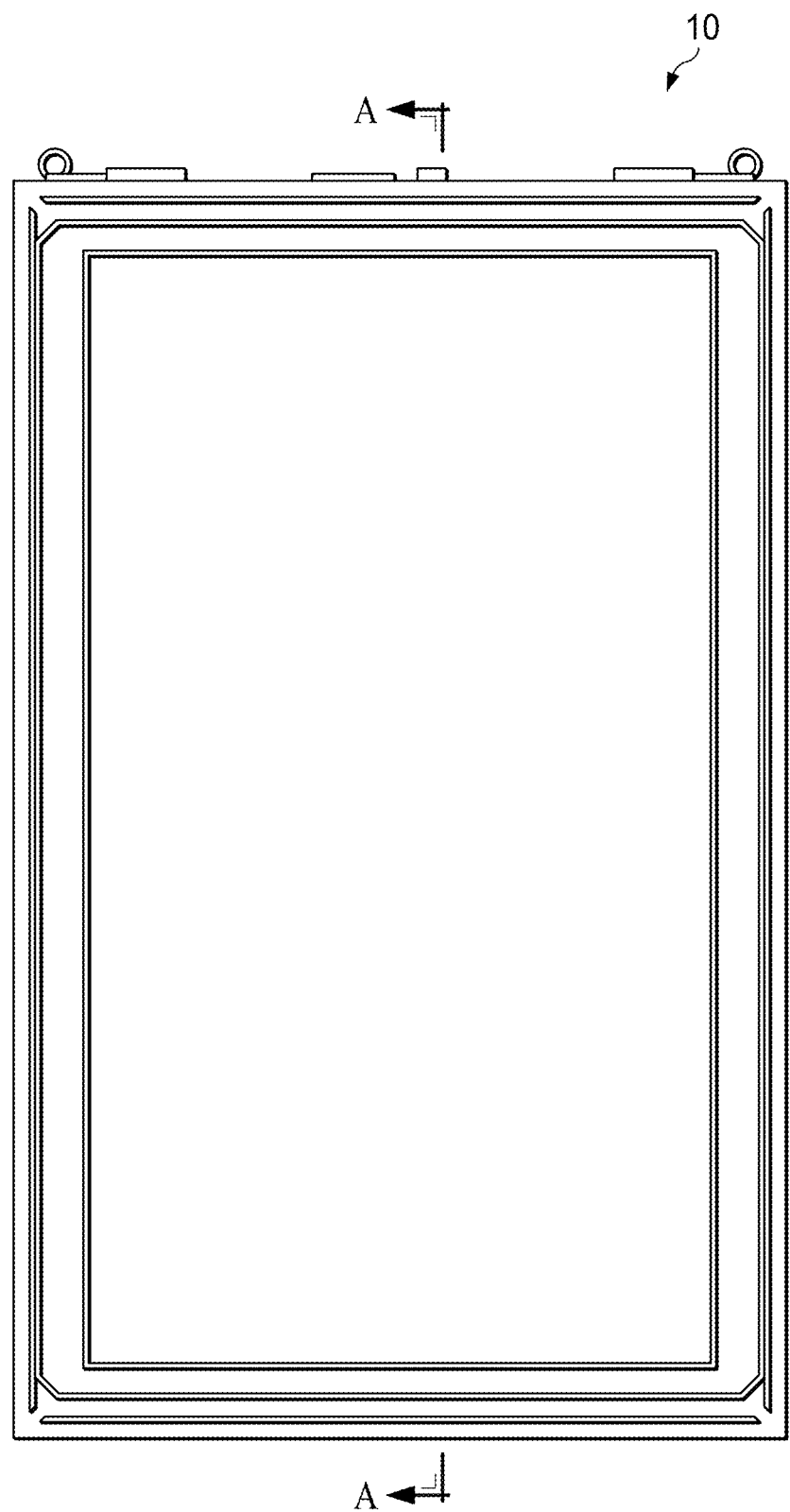
FIG. 1 is a front view of a display assembly indicating section line A-A.
Figure 2A:
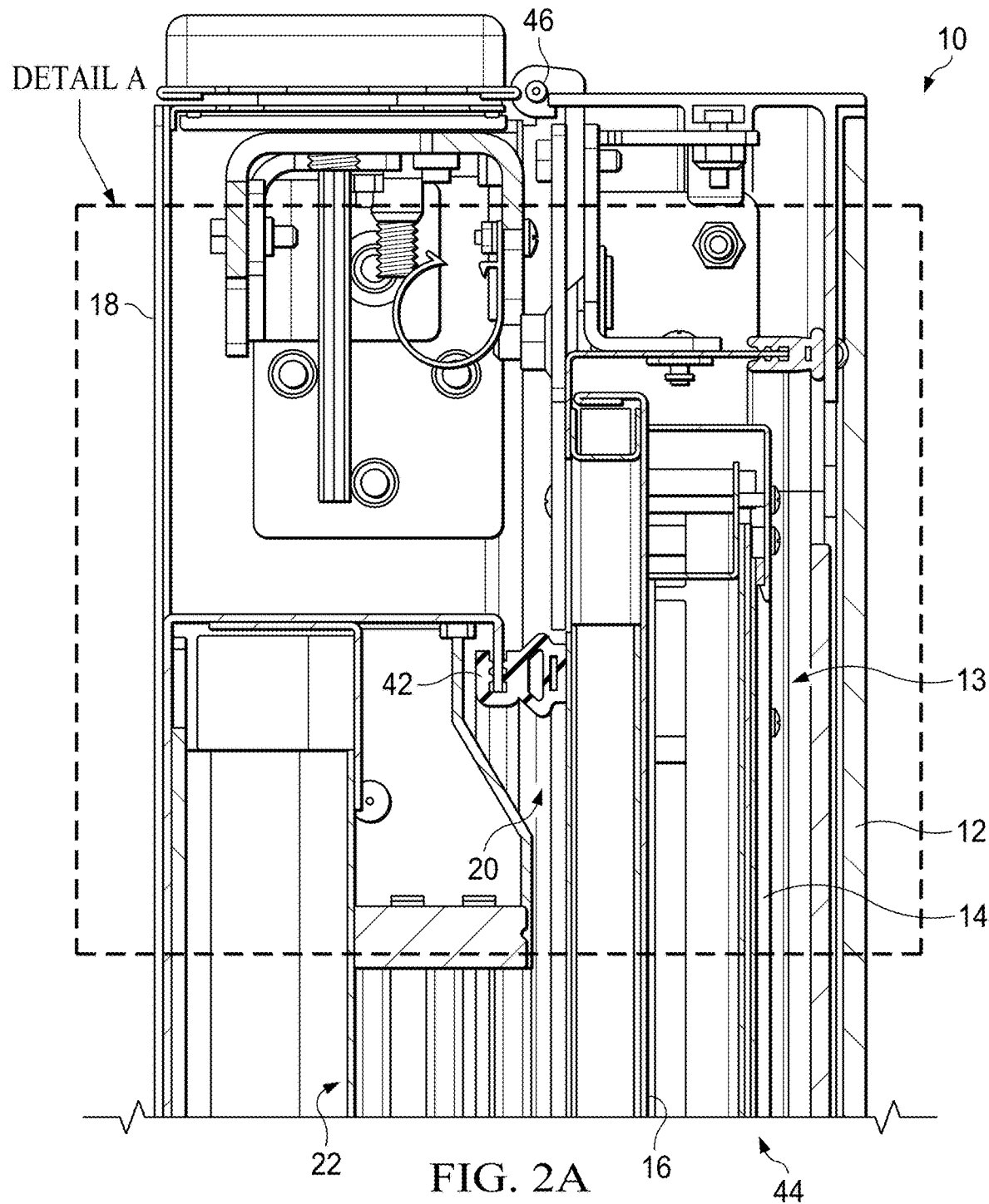
FIG. 2A is a detailed side sectional view of the display assembly of FIG. 1 taken along section line A-A and indicating detail A.
Figure 2B:
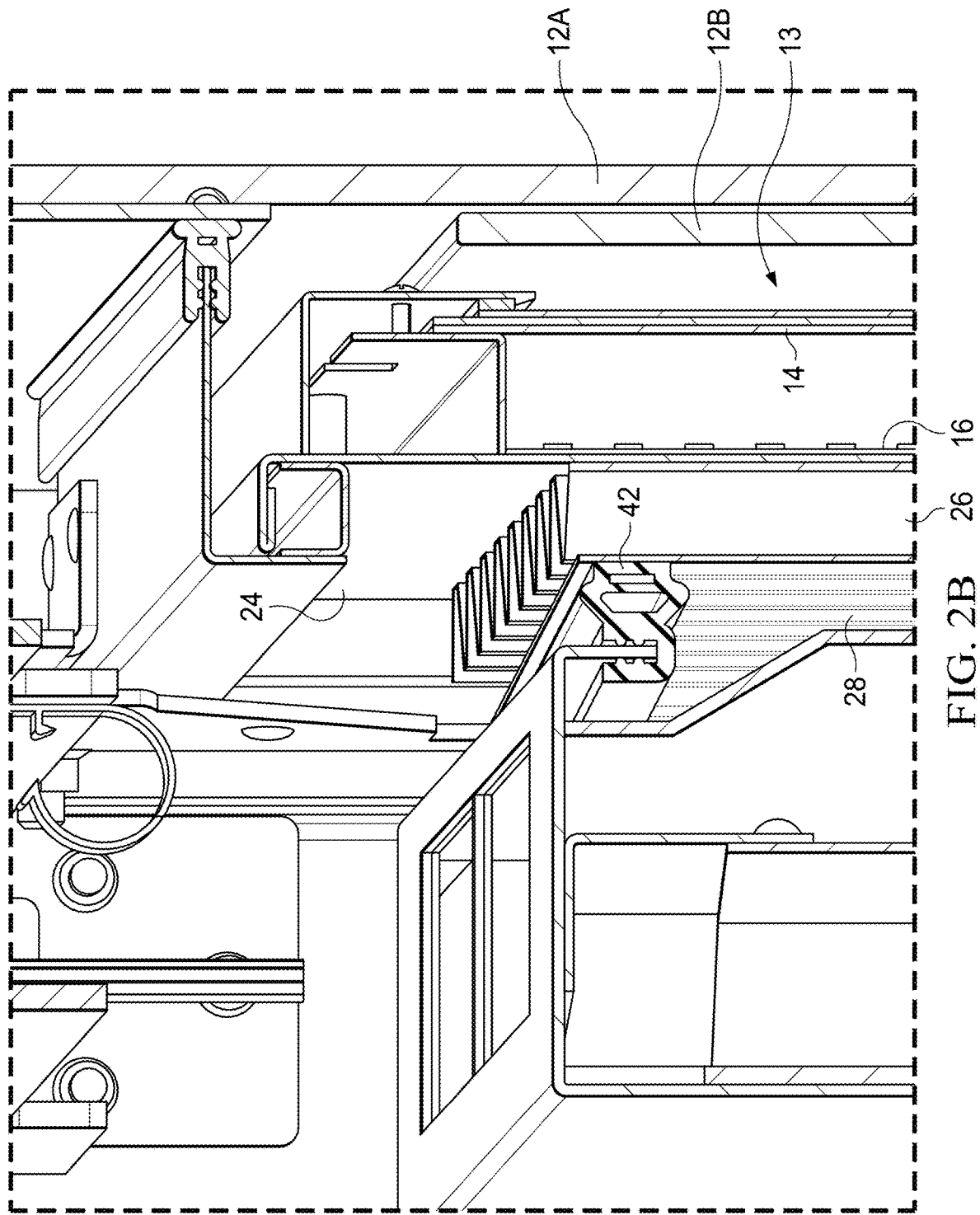
FIG. 2B is a detailed perspective view of detail A of FIG. 2A.

FIG. 1 through FIG. 2B illustrate an exemplary display assembly 10. The assembly 10 may comprise a housing 18. The assembly 10 may comprise a cover layer 12. The cover layer 12 may comprise a single layer or multiple layers 12A, 12B bonded together, such as by way of an optical adhesive. The cover layer 12 may be positioned forward of an electronic display layer 14. The cover layer 12 may be secured to the housing 18, directly or indirectly. The electronic display layer 14 may be secured to the housing 18, directly or indirectly. The electronic display layer 14 may comprise a layer of liquid crystals (e.g., an LCD), a plasma display, OLED display, LED display, combinations thereof, or the like.

The cover layer 12 may be transparent or translucent such that images displayed at the electronic display layer 14 are visible to an intended viewer through the cover layer 12. The cover layer 12 may comprise one or more polarizers, anti-reflective films, surface treatments, combinations thereof, or the like. The cover layer 12 may be configured to protect and/or enhance optics of the images displayed at the electronic display layer 14. A front gap 13 may extend between the cover layer 12 and the electronic display layer 14. The front gap 13 comprises a channel which may form part of a closed loop airflow pathway for circulating gas. Alternatively, the cover layer 12 may be optically bonded to the electronic display layer 14.

A backlight 16 may be provided rearward of the electronic display layer 14. In exemplary embodiments, the backlight 16 may comprise multiple light emitting diodes (LEDs) or other light sources configured to illuminate the electronic display layer 14 when powered. The backlight 16 may comprise multiple light sources mounted to one or more panels 24. The backlight 16 may comprise multiple tiles or blocks of light sources, each of which may be connected to a power source and/or a driver, which may be individual to the tile or block or common to multiple tiles or blocks. In exemplary embodiments, the backlight 16 may be configured to provide direct backlighting to the electronic display layer 14. In other exemplary embodiments, the backlight 16 may be configured to provide edge lighting to the electronic display layer 14, such as directly, or by way of one or more diffusers, reflection elements, combinations thereof, or the like. Where emissive type electronic display layers 14 are utilized, a separate backlight 16 may not be required.

The assembly 10 may comprise one or more thermal management substructures, including, but not necessarily limited to, a first heat exchange substructure 20. The first heat exchange substructure 20 may comprise a single or multiple layer heat exchanger, by way of non-limiting example. The first heat exchange substructure 20 may be provided rearward of the backlight 16 and/or the electronic display layer 14. In exemplary embodiments, the first heat exchange substructure 20 may extend, directly or indirectly, along some or all of the backlight 16 and/or electronic display layer 14 so as to absorb some or all of the heat generated by the backlight 16 and/or electronic display layer 14 when in use. The first heat exchange substructure 20 may extend directly along a rear panel of the backlight 16, though such is not required. For example, without limitation, the panel 24 may form a portion of the first heat exchange substructure 20, though spacing and/or other layers between the panel 24 and the first heat exchange substructure 20 may be provided.

The first heat exchange substructure 20 may comprise a corrugated layer 26. The corrugated layer 26 may comprise a single sheet of material bent to form peaks and valleys in exemplary embodiments. The corrugated layer 26 may comprise multiple sheets, panels, portions, and/or subcomponents which together form the corrugated layer 26. The corrugated layer 26 may comprise a zig-zag pattern which extends between two or more panels, thereby forming a number of subchannels or pathways, such as which are part of a larger channel or pathway. Alternatively, or additionally, the first heat exchange substructure 20 may comprise a number of tubes (e.g., square, rectangular, round, combinations thereof, or the like). The corrugated layer 26 may be secured to the panel 24, though such is not required. In other exemplary embodiments, without limitation, the corrugated layer 26 may be secured to another panel of the first heat exchange substructure 20 separate from the panel 24 and forming part of the backlight 16. The first heat exchange substructure 20 may comprise a second panel 28. The corrugated layer 26 and/or channels may extend between two panels of the first heat exchange substructure 20 to form passageways. Where the corrugated layer 26 comprises multiple parts, each part may be secured to the panel 24, second panel 28, and/or other component(s), by way of non-limiting example.

The first heat exchange substructure 20 may form part of an open loop airflow pathway configured to accept ambient air. In exemplary embodiments, the first heat exchange substructure 20 may be in fluid communication with one or more intakes and exhausts provided in the housing 18. Such intakes and exhausts may comprise one or more apertures.

The thermal management substructure of the assembly 10 may comprise other components, including, but not necessarily limited to, a second heat exchange substructure 22. The second heat exchange substructure 22 may comprise a multi-layer heat exchanger, by way of non-limiting example. The second heat exchange substructure 22 may be provided rearward of the backlight 16 and/or electronic display layer 14. In exemplary embodiments, the second heat exchange substructure 22 may be provided rearward of the first heat exchange substructure 20.

The second heat exchange substructure 22 may comprise multiple layers 36, at least some of which may form part of a same or a different open loop airflow pathway as the first heat exchange substructure 20, and at least some of which may form part of the same or a different closed loop airflow pathway as the front gap 13. Notably, the front gap 13 may not be required. The closed loop airflow pathway may extend within the housing 18. The second heat exchange substructure 22 may be in fluid communication with the same or different intakes and exhausts as the first heat exchange substructure 20. The second heat exchange substructure 22 may be in fluid communication with the front gap 13, though such is not required. The first and second heat exchange substructures 20, 22 may be mechanically separated from, or connected to, one another.

In exemplary embodiments, the display assembly 10 may comprise multiple electronic display layers 14. In such embodiments, the display assembly 10 may comprise multiple cover layers 12, backlights 16, first heat exchange substructure 20, second heat exchange substructure 22, combinations thereof, or the like. However, at least the second heat exchange substructure 22 may be common to multiple electronic display layers 14 in some embodiments. For example, without limitation, the display assembly 10 may comprise a first and second electronic display layer 14 provided in a back-to-back arrangement, such as with front gaps 13 fluidly connected to a common second heat exchange substructure 22 but which each utilize separate first heat exchange substructures 20, one for each electronic display layer 14 for example, without limitation. Such an arrangement is not required. Any number and/or arrangement of open loop airflow pathways, sub-pathways, channels, subchannels, or the like may be provided. Alternatively, or additionally, any number and/or arrangement of closed loop airflow pathways, sub-pathways, channels, subchannels, or the like may be provided. Any number and type of first heat exchange substructures 20 and/or second heat exchange substructures 22 may be provided. For example, one or more of the first heat exchange substructure 20 and/or second heat exchange substructure 22 may be used within the display assembly 10. Any number or type of electronic display layers 14 may be utilized which may share some or all parts of a thermal management substructure, or have entirely separate thermal management substructures.

In embodiments where the electronic display layer 14 self-illuminates, for example, without limitation, where the electronic display layer 14 comprises plasma, OLED, LEDs, combinations thereof, or the like, a separate backlight 16 may not be required. In such embodiments, the first heat exchange substructure 20, if utilized, may be provided along some or all of the electronic display layer 14.

The assembly 10 may comprise one or more fans. Some of the fans may be provided within the open loop airflow pathways for moving ambient air when activated. Other of the fans may be provided within the closed loop airflow pathways for moving circulating gas when activated. In other exemplary embodiments, fans may be common to both the open and closed loop airflow pathways.

The ambient air within the open loop airflow pathway may be entirely or substantially prevented from mixing with the circulating gas of the closed loop airflow pathway. For example, without limitation, the display assembly may be configured to comply with various ingress protection standards, such as, but not limited to, IP 65, IP 66, IP 67, IP 68, combinations thereof, or the like. Ambient air may comprise air ingested from the surrounding environment and may be filtered. The circulating gas may comprise air kept fully or partially separate from the ambient air. For example, the circulating gas may be ambient air trapped when the assembly 10 is formed or otherwise periodically accessed (e.g., for servicing). Alternatively, or additionally, the circulating gas may comprise filtered or purified air.

The first heat exchange substructures 20 and/or second heat exchange substructures 22 may be configured to facilitate such separation. The first heat exchange substructures 20 and/or second heat exchange substructures 22 may be of any type, including, but not limited to, cross flow, counter flow, co-current, counter current, hybrid, direct, indirect, parallel flow, shell and tube, tube in tube, double tube, plate type heat exchangers, combinations thereof, or the like. Alternatively, or additionally, one or both of the first heat exchange substructures 20 and/or second heat exchange substructures 22 may be configured to mix air between the open and closed loops and may comprise a mixing chamber, by way of non-limiting example.

Figure 3B:
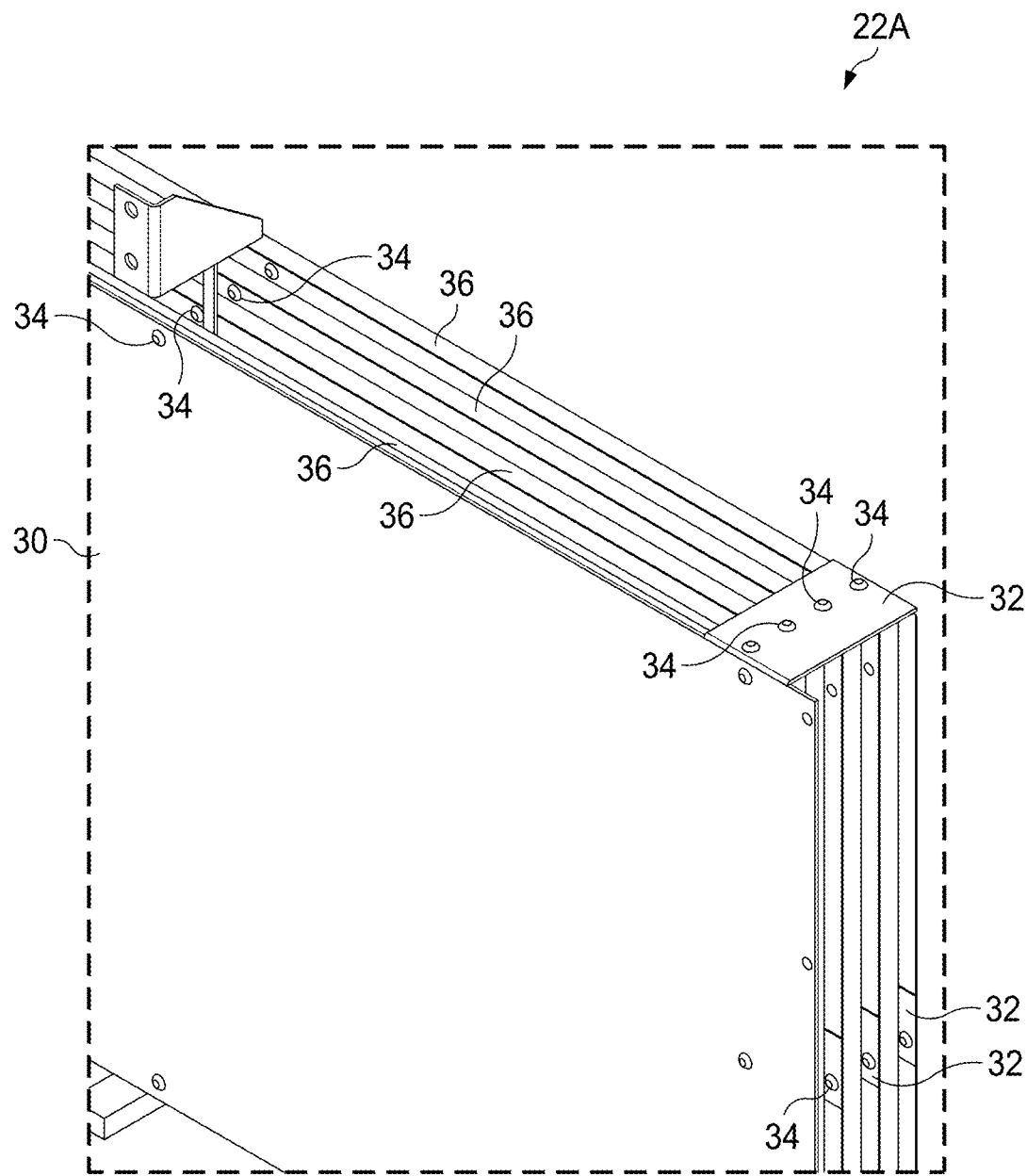
FIG. 3B is a detailed perspective view of detail B of FIG. 3A.

FIG. 3A and FIG. 3B illustrate an embodiment of the second heat exchange substructure 22A using fasteners 34. The second heat exchange substructure 22A may comprise a number of layers 36. Some of the layers 36 may form part of one or more of the open loop airflow pathways for ambient air, and some others may form part of one or more of the closed loop airflow pathways for circulating gas. For example, without limitations, the layers 36 may be configured to alternately accept ambient air and circulating gas on a layer-by-layer basis. The second heat exchange substructure 22A may comprise one or more panels 30, such as, but not limited to, a front and rear panel. One or more members 32 may extend between the panels 30 and/or along some or all of the layers 36. Such members 32 may be spaced apart along some or all of the second heat exchange substructure 22A. Such members 32 may, alternatively or additionally, be provided between layers 36 to space the layers 36 apart. The second heat exchange substructure 22A may comprise a number of fasteners 34 provided on the panel(s) 30, the layer(s) 36, and/or the members 32. The fasteners 34 may penetrate through one or more of the panels 30, the layers 36, and/or the members 32. The fasteners 34 may comprise screws, rivets, bolts, nails, combinations thereof, or the like.

Significant compressive force may be provided at or adjacent to the fasteners 34 as a result of torqueing during installation of the fasteners 34. However, moving further from the fasteners 34, less compressive force may be provided as a result of torqueing during installation of the fasteners 34. This may result in uneven surfaces, inadequate sealing, less structural rigidity, combinations thereof, and the like of the assembly 10 or components thereof.

Figure 4B:
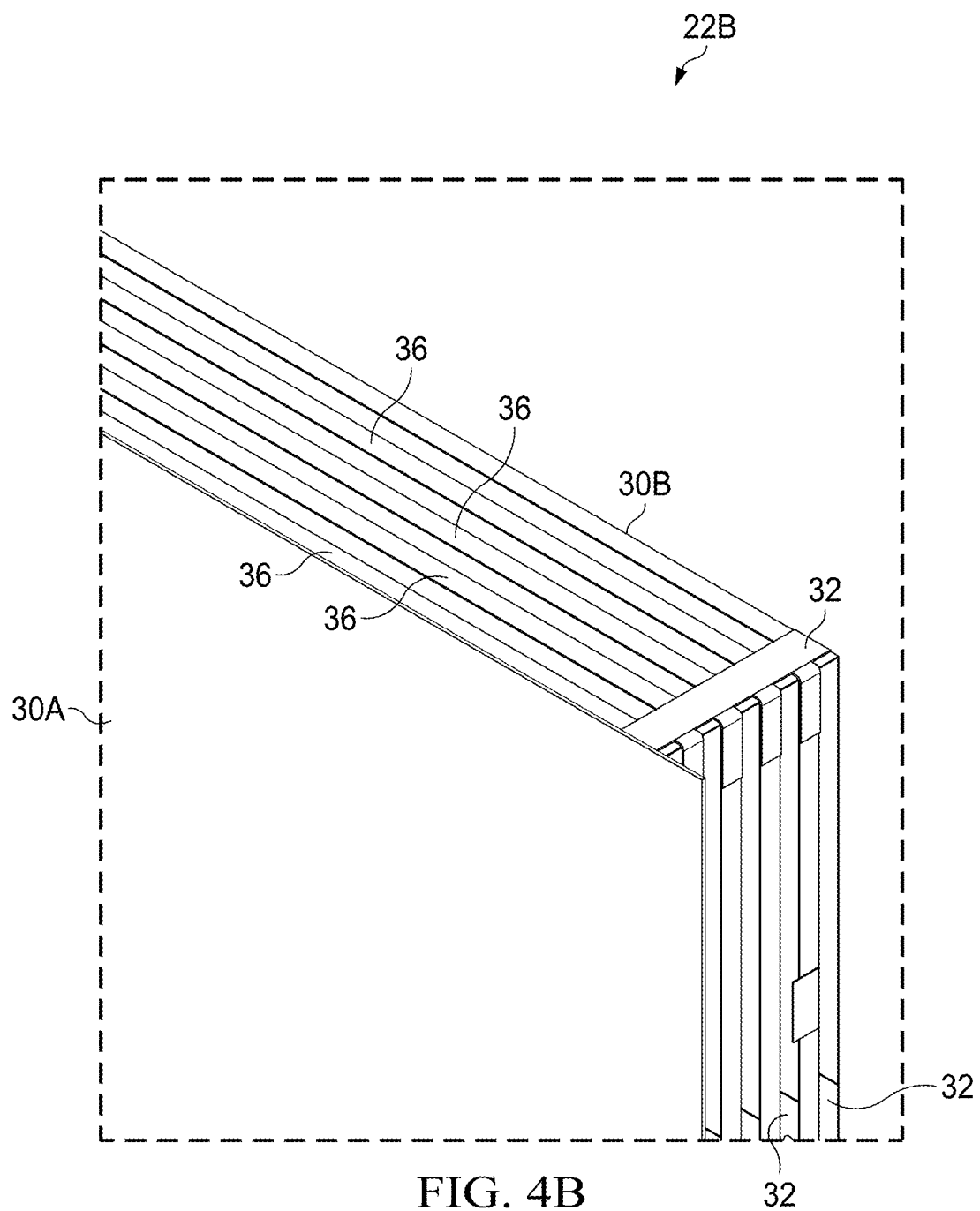
FIG. 4B is a detailed perspective view of detail C of FIG. 4A.

FIG. 4A and FIG. 4B illustrates another embodiment of the second heat exchange substructure 22B using structural adhesive. The second heat exchange substructure 22B may have the same, or similar, components arranged in the same or similar manner as the second heat exchange substructure 22A, though such is not required. Fewer or no fasteners 34 may be utilized compared to the second heat exchange substructure 22B. Instead of some or all of the fasteners 34, a structural adhesive may be utilized with the second heat exchange substructure 22B. In exemplary embodiments, the structural adhesive may be provided between each layer 36, at the members 32, at the panels 30A, 30B, combinations thereof, or the like. The structural adhesive may, alternatively or additionally, be provided on outer portions of the second heat exchange substructure 22B to connect the second heat exchange substructure 22B to other components of the display assembly 10, such as, but not limited to, the panel 24, the second panel 24B, the housing 18, the first heat exchange substructure 20A, 20B, the backlight 16, a structural member, other component, combinations thereof, or the like.

The open loop airflow pathway for the second heat exchange substructure 22B may be at least partially separated from the open loop airflow pathway for the first heat exchange substructure 20B. For example, without limitation, ambient air may be ingested through separate intakes and exhausted through separate exhausts. As another example, without limitation, ambient air may be ingested through a common intake and separated so that a first portion travels through a first open loop airflow pathway to the first heat exchange substructure 20B and a second portion travels through a second open loop airflow pathway to the second heat exchange substructure 22B before being exhausted through separate, or common, exhausts.

Multiple second heat exchange substructures 22B may be utilized in a display assembly 10 and/or a single second heat exchange substructure 22B may be broken up into portions or sections.

FIG. 5A, FIG. 6A, FIG. 7A, and FIG. 8A illustrate an embodiment of the first heat exchange substructure 20A using fasteners 34. The fasteners 34 may be provided along peaks and/or valleys of the corrugated layer 26. Multiple corrugated layers 26 may be provided, such as adopt one another, adjacent to one another, combinations thereof, or the like. Alternatively, or additionally, the corrugated layers 26 may be provided in multiple portions. The fasteners 34 may extend through front or rear panels of the first heat exchange substructure 20A and/or to the panel 24, the second panel 28, the backlight 16, the housing 18, structural member, other component, combinations thereof, or the like.

Significant compressive force may be provided at or adjacent to the fasteners 34 as a result of torqueing the fasteners 34 during installation. However, moving further from the fasteners 34, less compressive forces may be provided. This may result in uneven surfaces, inadequate sealing, less structural rigidity, combinations thereof, and the like.

FIG. 5B, FIG. 6B, FIG. 7B, and FIG. 8B illustrate an embodiment of the first heat exchange substructure 20B using structural adhesive. The first heat exchange substructure 20B may have the same, or similar, components arranged in the same or similar manner to the first heat exchange substructure 20A, though such is not required. However, fewer or no fasteners 34 may be utilized. Instead of some or all of the fasteners 34, the structural adhesive may be utilized. In exemplary embodiments, the structural adhesive may be provided along the peaks and/or valleys of the corrugated layer 26.

The structural adhesive may connect the corrugated layer 26 to front and/or rear panels of the first heat exchange substructure 20B, such as, but not limited to, the panel 24, the second panel 28, combinations thereof, or the like. The structural adhesive may be provided on outer surfaces of the first heat exchange substructure 20B to connect the first heat exchange substructure 20B to other components of the display assembly 10 such as, but not limited to, the second heat exchange substructure 22A, 22B, the backlight 16, the housing 18, structural member, other component, combinations thereof, or the like.

Figure 9:
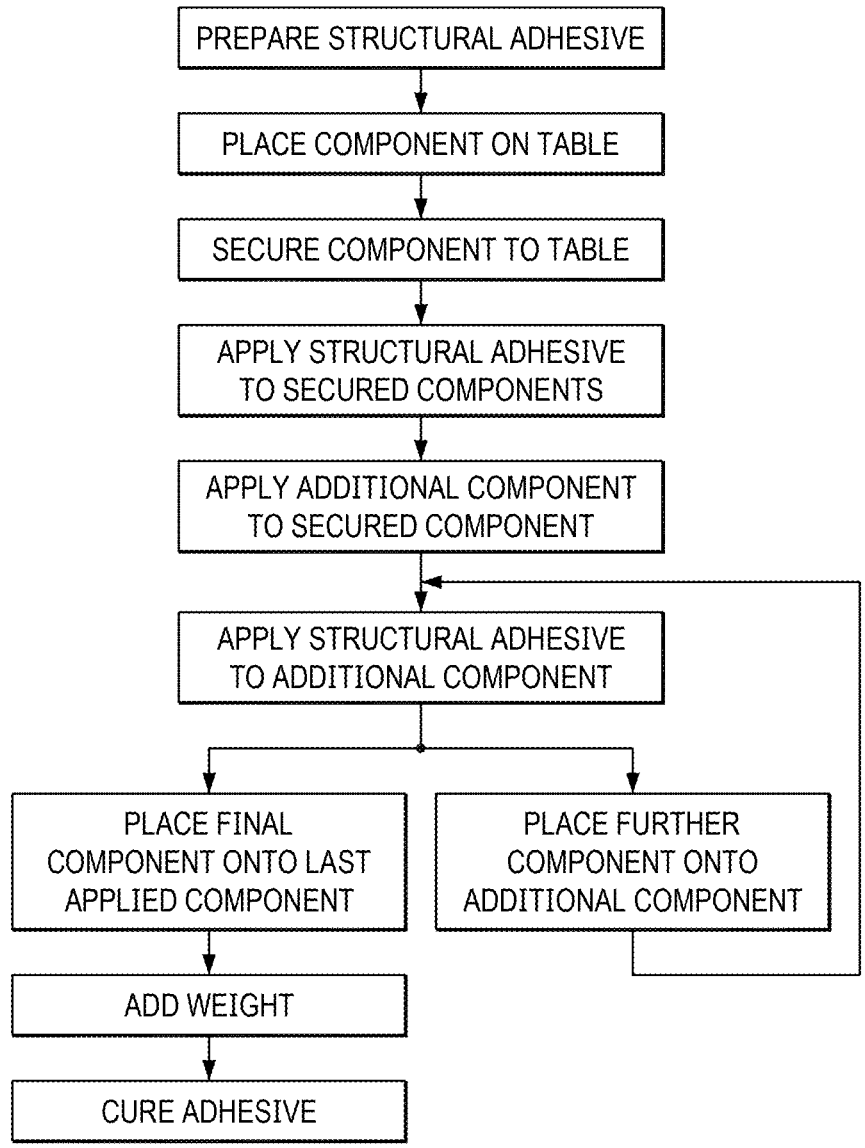
FIG. 9 is a flow chart for an exemplary process for creating the display assembly, or subassemblies thereof, using structural adhesive.
Figure 10:
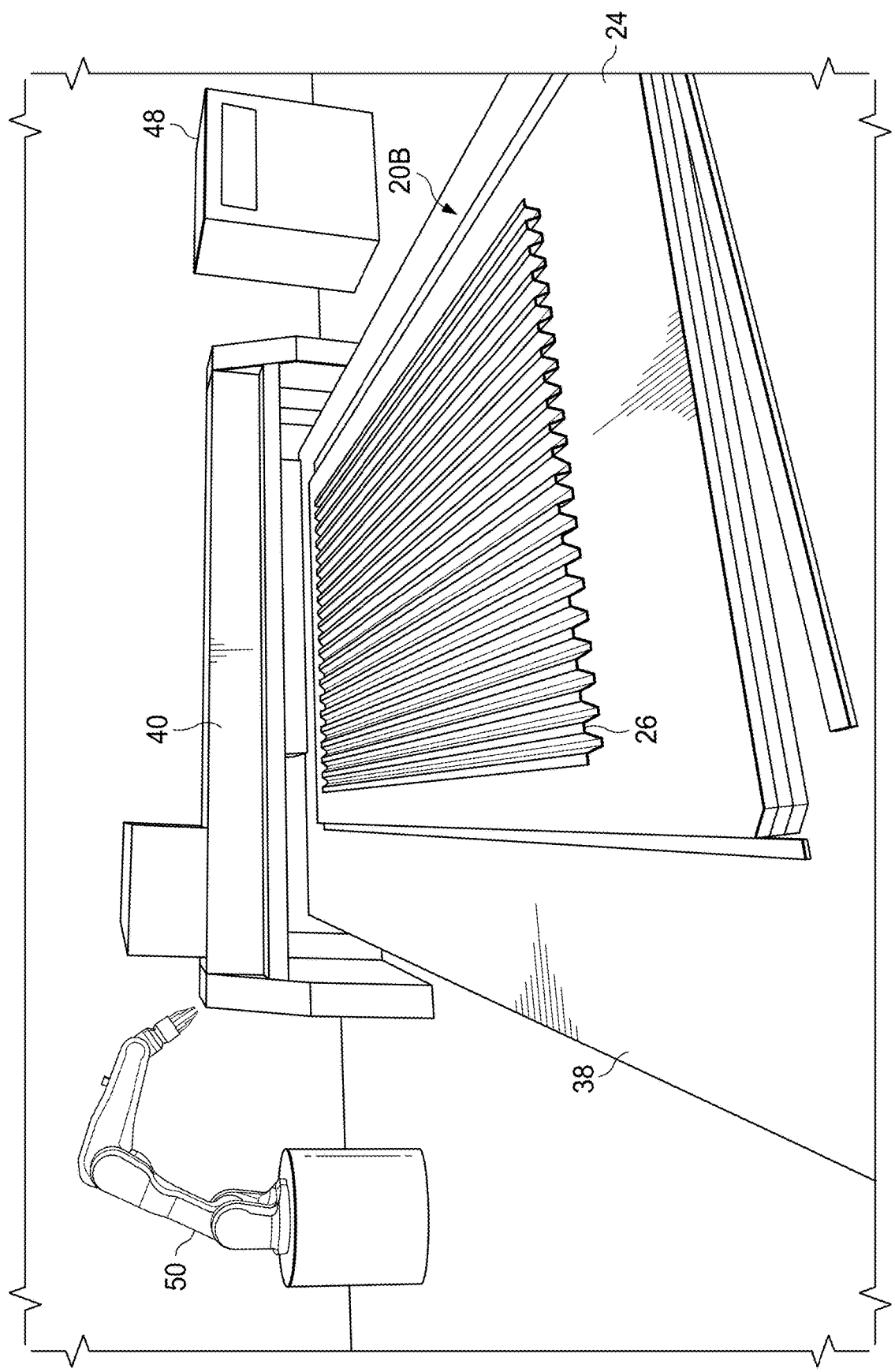
FIG. 10 is a perspective view of an exemplary first heat exchange substructure partially completed and undergoing manufacture.

FIG. 9 explains how the assembly 10, or components thereof, such as, but not limited to, the first heat exchange substructure 20B and/or the second heat exchange substructure 22B may be created or otherwise partially or fully manufactured using the structural adhesive. FIG. 10 provides an example of a portion of the assembly 10, and specifically of an exemplary first heat exchange substructure 20B, partially assembled. The process shown and/or described herein may be utilized for any number of components of the assembly 10, including, but not limited to, the second heat exchange substructure 22B.

The structural adhesive may be prepared. Preparation of the structural adhesive may include mixing one or more materials. The structural adhesive may comprise a pressure sensitive adhesive. The pressure sensitive adhesive ("PSA") may be a natural rubber PSA, synthetic rubber PSA, acrylic PSA, silicon PSA, combinations thereof, or the like. Other types or kinds of adhesives may alternatively, or additionally, be utilized. The adhesive or other portion of the structural adhesive may comprise multiple parts which require mixing before application.

The adhesive or other portion of the structural adhesive may be mixed with, or otherwise include, a spacing material. The spacing material may comprise an inert material. For example, without limitation, the spacing material may comprise glass beads of a particular size, such as, but not limited to, $10/1000$ths of an inch, though any size or multiple sizes may be used, such as, but not limited to, between $1/1000$ths of an inch and $100/1000$ths of an inch. The utilizing of a spacing material as part of, or with, the structural adhesive may provide the necessary gap between components for the adhesive to remain and activate application. For example, without the spacing material the adhesive may otherwise be displaced upon sufficient compression of the components. The spacing material may, alternatively, or additionally, be utilized to provide increased dimensional accuracy of the resulting subassemblies and/or display assembly 10 by providing more exact and consistent spacing between adhered components. The tolerance and consistency of resulting spacing using the structural adhesive with spacing material may be improved relative to the use of fasteners 34. In exemplary embodiments, the spacing material may be applied at 2.5% by weight into part or all of the structural adhesive and mixed until substantially homogenous, though any amount may be utilized such as, but not limited to, between 0.5% and 10% by weight.

In exemplary embodiments, the structural adhesive may be mixed by a computer-controlled system 48. The system 48 may comprise one or more reservoirs comprising components of the structural adhesive. The system 48 may comprise one or more pumps or other components for drawing or otherwise forcing the components of the structural adhesive together, such as, but not limited to, into a mixing chamber, through one or more tubes, combinations thereof, or the like. The system 48 may comprise, or be in electronic communication with, one or more temperature sensors, pressure sensors, combinations thereof, or the like, and may adjust an amount, flow rate, percentage, combinations thereof, or the like of the components of the structural adhesive utilized based on readings from the sensors.

A component may be placed on a table 38. The component may be a part of the first or second heat exchange substructure 20, 22, the housing 18, or another component of the assembly 10 by way of non-limiting example. The table 38 may comprise a substantially planar upper surface to improve flatness of the resulting subassembly and/or display assembly 10. Such placement may be achieved by one or more robots 50. The components may be retrieved from one or more material carts and/or autonomous guided vehicles (AGVs), including, but not limited to, those provided by AGILOX Systems GmbH (www.agilox.net/en/). The one or more robots 50 may comprise material handling robots, such as, but not limited to, those available from FANUC America Corp. of Rochester Hills, MI (www.fanucamerica.com/) though any type or kind of robots 50 may be utilized. In exemplary embodiments, at least some of the one or more robots 50 may be placed on a track and may have a reach of approximately 10 ft.

The component may be secured to the table 38, such as by a vacuum, clamps, static weight, the one or more robots, combinations thereof, or the like. The table 38 and/or at least one of the one or more robots may be those available from AXYZ Automation Inc. of Burlington, Ontario, Canada (www.axyz.com/us/) though any type or kind of table 38 may be utilized. In exemplary embodiments, the component secured to the table 38 may comprise a front or rear panel 24, 28 of the first heat exchange substructure 20B, a front or rear panel 30A, 30B of the second heat exchange substructure 22B, the housing 18 or component thereof, combinations thereof, or the like. However, any component of the assembly 10 may be so secured.

A structural adhesive may be applied to the secured component. The structural adhesive, in exemplary embodiments, may be applied by the system 48 and/or one or more robots 40. For example, without limitation, the table 38 may comprise one or more gantry-based robots 40 configured to automatically prepare and/or apply the structural adhesive to desired locations on the component. The robots 40 may comprise fluid dispensing robots in exemplary embodiments.

Additional components may be applied on top of the secured component to further complete a subassembly. Alternatively, or additionally, the structural adhesive may be applied to the non-secured component. Additional applications of structural adhesive may be applied, and additional components secured as needed to complete the subassembly. For example, without limitation, an additional panel 24, 28 of the first heat exchange substructure 20B may be provided. As another example, without limitation, additional layers 36 and/or panels 30A, 30B may be provided. In this fashion, one or more components of the assembly 10, such as, but not limited to, the first heat exchange substructure 20 and/or the second heat exchange substructure 22, may be manufactured. However, any number, kind, and/or type of components and/or substructures for the assembly 10 may be manufactured in this fashion. Furthermore, such completed components and/or substructures may be installed at the assembly 10 in this fashion.

Once the final component(s) for the subassembly, or assembly 10, are positioned, weight may be added. In exemplary embodiments, the weight may be static weight and may comprise a number of plywood and/or medium density fiberboard sheets stacked atop a polymer sheet. The weights may be positioned manually, by the one or more robots, a forklift, combinations thereof, or the like. In exemplary embodiments, 1.25 lbs./sq. in. of structural adhesive contact area may be applied to a given subassembly or the assembly 10. This may translate to, for example, without limitation, approximately 400 lbs. of weight applied to display assemblies 10 comprising a 55-inch electronic display layer 14, and approximately 600 lbs. for display assemblies 10 comprising a 75-inch electronic display layer 14. However, any ratio may be utilized such as, but not limited to, between 0.5 and 5 lbs./sq. in.

The structural adhesive may be cured. Curing may be accomplished by the passage of time (e.g., 30-120 mins), the addition of the weights, application of light (e.g., visible spectrum, UV, etc.), application of an accelerate or other material, exposure to ambient or forced airflow, combination thereof, or the like. In exemplary embodiments, curing may be accomplished and/or accelerated by exposing the structural adhesive to particular temperatures, light sources, materials, combinations thereof, or the like. However, such applications and/or curing may be performed at room temperature or ambient conditions.

For example, without limitation, considering the first heat exchange substructure 20B, the structural adhesive may be applied at locations where troughs or ridges of the corrugated layer 26 attach to the panel 24, the second panel 28, different portions of the corrugated layer 26, combinations thereof, or the like. If tubes are utilized, the structural adhesive may be applied at locations where the tubes connect to the panel 24, the second panel 28, other tubes, combinations thereof, or the like.

As another example, without limitation, considering the second heat exchange substructure 22B, the structural adhesive may be applied between layers 36, to different portions of the layers 36, at the front or rear panels 30A, 30B, at the members 32, combinations thereof, or the like to secure such components to one another.

The structural adhesive may be applied to any component (s) of, and at any location within, the display assembly 10 in any pattern or amount. In exemplary embodiments, the structural adhesive may comprise one or more pressure sensitive adhesives. The structural adhesive may comprise one or more methyl methacrylate adhesives. The structural adhesive may comprise those available from PLEXUS Corp., under the PLEXUS® brand of Neenah, WI (www.plexus.com/en-us/) including, but not limited to, MA8110 and/or MA8120 for example, without limitation. Any type or kind of structural adhesive may be utilized.

The completed subassembly may be released from the table 38, moved to another location, and/or joined with other subassemblies (such as by way of the structural adhesive, though such is not required) to form the display assembly 10. In exemplary embodiments, the completed subassembly may be joined to other components of the assembly 10 using the same or different structural adhesive, though such is not required. Such movement may be made by one or more robots, manually, combinations thereof, or the like.

The use of structural adhesive in place of fasteners 34 may provide a number of advantages in the resulting subassembly (e.g., second heat exchange substructure 22B, first heat exchange substructure 20B, or other component) and/or display assembly 10. For example, without limitation, torsional rigidity may be improved, strength may be increased, noise may be decreased (e.g., from 70 dB to 60 dB), tolerances may be improved, vibrations may be decreased, additional layers may be added to the second heat exchange substructure 22B and/or first heat exchange substructure 20B to increase cooling, sealing may be improved resulting in a decreased need for cooling, less material and/or labor may be required for assembly (e.g., 1.25 man hours to 0.6 man hours), holes may not need cut for fasteners 34 resulting in less work, fewer potential leak points, increased strength and rigidity, combinations thereof, and the like. Alternatively, or additionally, dimensional accuracy may be improved by decreasing bond line thicknesses (e.g., from $30/1000$ths of an inch to $10/1000$ths of an inch) thereby providing more room, increasing thermal conductivity between components, combinations thereof, and the like. Furthermore, consistency of spacing may be increased, particularly by use of the spacing material in the adhesive, thereby improvising dimensional accuracy and consistency. The overall size of the second heat exchange substructure 22B and/or first heat exchange substructure 20B, or components thereof (e.g., corrugated layer 26 and/or layers 36), may be increased due to the tightened tolerances and/or increased dimensional accuracy. As yet another example, without limitation, the resulting subassemblies and/or assembly 10 may be flatter and may resist bowing, resulting in greater sealing between components such as the first heat exchange substructure 20B, which may be provided within an access assembly 44 comprising the electronic display assembly 14 attached to the housing 18 by way of one or more hinges 46. This may result in a decreased amount of force required between the access assembly 44 and the housing 18 to maintain a seal with a gasket 42 which may extend between the housing 18 and the access assembly.

Figure 11:
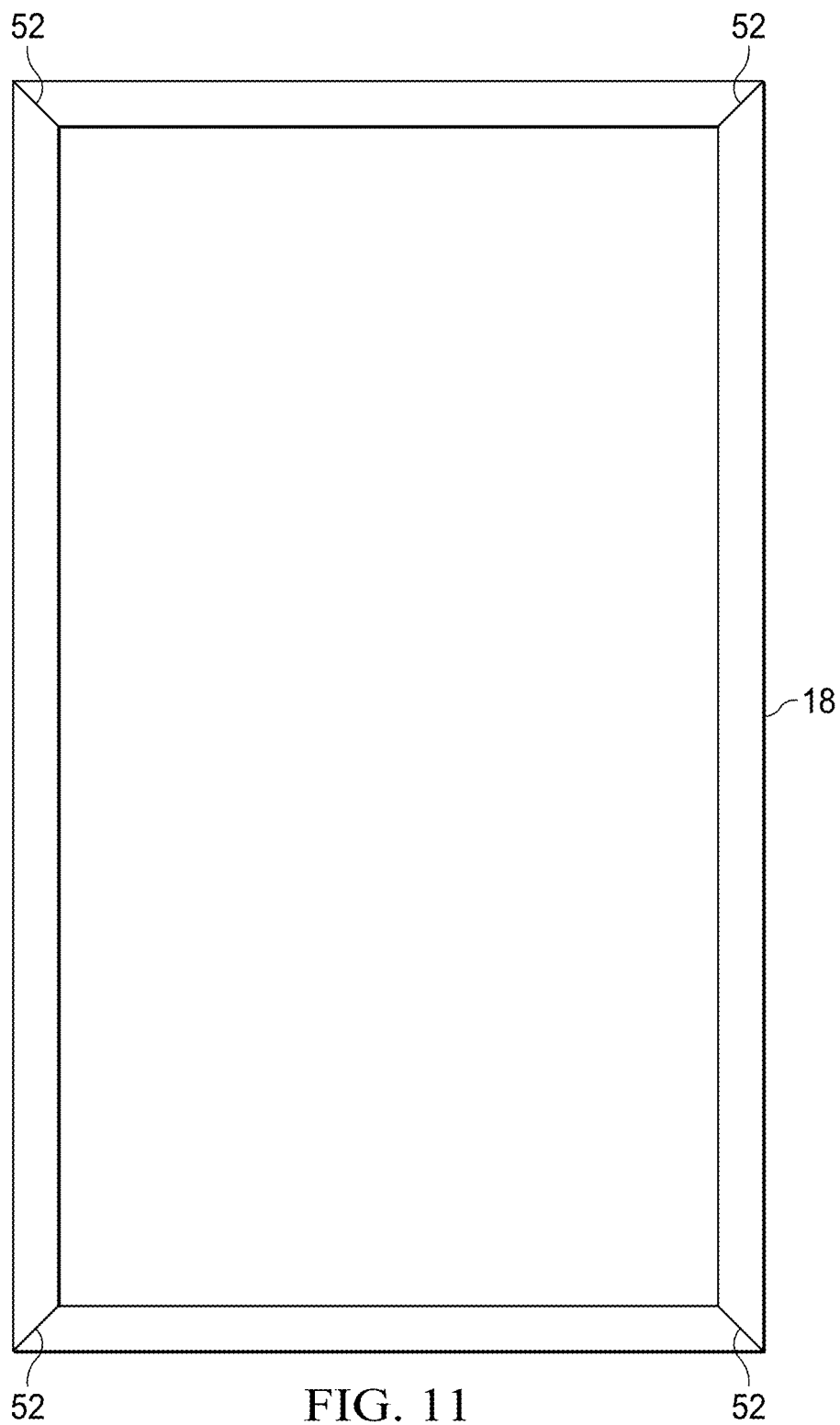
FIG. 11 is a rear view of an exemplary portion of the housing of the assembly of FIG. 1.

For example, without limitation, the structural adhesive may be used in place of other joints and/or to attach other components of the display assembly 10. In exemplary embodiments, without limitation, the structural adhesive may be used in fasteners or welding. For example, without limitation, the structural adhesive may be used at corner joints 52 of the housing 18, other housings and/or structural members for various subassemblies, other components of the display assembly 10, combinations thereof, or the like. An example of where the structural adhesive may be used at corner joints 52 of the housing 18 is provided at FIG. 11 as an example, without limitation. This may reduce or eliminate the need for welding and subsequent grinding and finishing. In exemplary embodiments, corner joints for a frame of the access panel subassembly 44 may be joined by structural adhesive. Welding such components may result in shrinkage to an hourglass shape making it difficult to accommodate the cover layer 12. The use of structural adhesive may reduce or eliminate this problem. For example, four members may be formed into a substantially rectangular shape, and the structural adhesive may be applied at mitered edges of the joint, such as in place of welding. The members may be secured by clamps, by robots, combinations thereof, or the like, while the structural adhesive cures. This may provide a squarer resulting framework to accommodate a squarer cover layer 12. Any number, size, and/or shape members may be used to provide any type, kind, and/or shape of framework. Adhered components may be subsequently finished, such as by cleaning, surface treatment, further assembly, painting, powder coating, combinations thereof, or the like, though such is not required.

The various components shown and/or described herein may comprise one or more metals, polymers, combinations thereof, or the like. In exemplary embodiments, the various components of the first heat exchange substructure 20, the second heat exchange substructure 22, and/or components thereof (e.g., the layers 36, the members 32, and/or the corrugated layer 26) and/or attached thereto (e.g., the housing 18, the panel 24, and/or the second panel 28) comprise metal. For example, without limitation, the various components may be cut, pressed, and/or bended sheets of metal, such as steel, aluminum, titanium, combinations thereof, or the like.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

Certain operations described herein may be performed by one or more electronic devices. Each electronic device may comprise one or more processors, electronic storage devices, executable software instructions, and the like configured to perform the operations described herein. The electronic devices may be general purpose computers or a specialized computing device. The electronic devices may comprise personal computers, smartphones, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A display assembly comprising:
an electronic display for displaying images;
a housing for the electronic display; and
a thermal management substructure located within the housing rearward of the electronic display, wherein the thermal management substructure comprises a heat exchanger comprising multiple layers, where at least one of the layers is formed into peaks and valleys, said layers are secured to one another by a plurality of deposits of structural adhesive, and where at least some of said plurality of deposits of structural adhesive are provided at said peaks and said valleys of the at least one of the layers.

2. The display assembly of claim 1 wherein:
said structural adhesive comprises a pressure sensitive adhesive and a spacing material.

3. The display assembly of claim 2 wherein:
the plurality of deposits of structural adhesive are spaced apart from one another.

4. The display assembly of claim 3 wherein:
the pressure sensitive adhesive comprises methyl methacrylate;
the spacing material comprises glass beads, each having a diameter between about $1/1000$ths and about $100/1000$ths of an inch; and
each of the layers of the heat exchanger which are secured to one another by the structural adhesive comprise metal.

5. The display assembly of claim 4 wherein:
the thermal management substructure comprises the heat exchanger and a second heat exchange substructure;
said second heat exchange substructure comprises multiple layers;
the layers of said heat exchanger comprises a first panel, the at least one of the layers formed into peaks and valleys ("corrugated layer"), and a second panel;
said corrugated layer is secured by said at least some of said plurality of deposits of structural adhesive provided at said peaks and said valleys of the corrugated layer to the first panel and to the second panel of said heat exchanger;
said first panel extends between, and separates, said electronic display and said second heat exchange substructure;
said second panel extends between, and separates, said corrugated layer from the multiple layers of the second heat exchange substructure; and
said first panel, said corrugated layer, and said second panel at least partially define a channel for airflow.

6. The display assembly of claim 5 wherein:
the plurality of deposits of structural adhesive are provided in lines.

7. The display assembly of claim 6 further comprising:
an open loop pathway for ambient air comprising said channel and a first number of said multiple components of said second heat exchange substructure;
a closed loop pathway for circulating gas comprising a second number of said multiple components of said second heat exchange substructure;
a cover layer positioned forward of said electronic display; and
an access assembly comprising said electronic display and said cover layer, wherein said access assembly is moveably mounted to a remaining portion of said housing.

8. The display assembly of claim 7 wherein:
said electronic display comprises a layer of liquid crystals and a backlight; and
said channel extends along at least a portion of a rear surface of the backlight.

9. The display assembly of claim 1 wherein:
said layers of said thermal management substructure are held together by said structural adhesive without requiring other forms of fasteners.

10. A display assembly comprising a thermal management substructure comprising multiple layers, said display assembly created by a process comprising the steps of:
moving, by way of a robot, a first panel of the thermal management substructure to a table;
securing said first panel to said table;
mixing, by way of a computer-controlled system, multiple components of a structural adhesive;
depositing, by way of a robotic system, said structural adhesive along portions of said first panel corresponding to planned locations of troughs of a corrugated layer of the thermal management substructure;
placing, by way of the robot, the corrugated layer atop the first panel such that the structural adhesive deposited at the first panel is interposed between the troughs and the first panel;
depositing, by way of the robotic system, additional amounts of the structural adhesive along ridges of said corrugated layer; and
placing, by way of the robot, a second panel of thermal management substructure atop the corrugated layer such that the additional amounts of the structural adhesive deposited at the corrugated layer are interposed between the ridges and the second panel.

11. The display assembly created by the process of claim 10, wherein:
said structural adhesive comprises a pressure sensitive adhesive comprising methyl methacrylate and glass beads of a predetermined size.

12. The display assembly created by the process of claim 11, wherein:
the structural adhesive is deposited in spaced apart lines along said troughs and said ridges.

13. The display assembly created by the process of claim 12, wherein:
the first panel is secured to the table by way of a vacuum system.

14. The display assembly created by the process of claim 12, wherein the process further comprises:

depositing, by way of the robotic system, additional amounts of the structural adhesive along the second panel corresponding to planned locations of a first one of the multiple layers of a second heat exchange substructure of the thermal management substructure;

placing, by way of the robot, the first one of the multiple layers of the second heat exchange substructure atop the second panel;

depositing, by way of the robotic system, additional amounts of the structural adhesive along the first one of the multiple layers corresponding to planned locations of a second one of the multiple layers of the second heat exchange substructure;

placing, by way of the robot, the second one of the multiple layers of the second heat exchange substructure atop the first one of the multiple layers of the second heat exchange substructure; and securing the second heat exchange substructure within the display assembly such that a first heat exchange substructure formed, at least in part, by said first panel, said second panel, and said corrugated layer as well as one of the first and second ones of the multiple layers of the second heat exchange substructure form part of an open loop airflow pathway for ambient air when placed in a housing of said display assembly located rearward of an electronic display surface secured within said housing.

15. The display assembly created by the process of claim 14, wherein:
the additional amounts of the structural adhesive are deposited in spaced apart lines.

16. A display assembly comprising a thermal management substructure comprising a first heat exchange substructure and a second heat exchange substructure, said second heat exchange substructure comprising multiple layers, said display assembly created by a process comprising the steps of:
moving, by way of a robot, a first panel to a table;
activating a vacuum system at said table to secure said first panel to said table;
mixing, by way of a computer-controlled system, multiple components of a structural adhesive, wherein said structural adhesive comprises a pressure sensitive adhesive comprising methyl methacrylate and glass beads of a predetermined size;
depositing, by way of a robotic system, said structural adhesive along portions of said first panel corresponding to planned locations of troughs of a corrugated layer in spaced apart lines;
placing, by way of the robot, the corrugated layer atop the first panel such that the structural adhesive deposited at the first panel is interposed between the troughs and the first panel;
depositing, by way of the robotic system, additional amounts of the structural adhesive along ridges of said corrugated layer in spaced apart lines;
placing, by way of the robot, a second panel atop the corrugated layer such that the additional amounts of the structural adhesive deposited at the corrugated layer are interposed between the ridges and the second panel;
depositing, by way of the robotic system, additional amounts of the structural adhesive along the second panel corresponding to planned locations of a first one of the multiple layers of the second heat exchange substructure;
placing, by way of the robot, the first one of the multiple layers of the second heat exchange substructure atop the second panel;
depositing, by way of the robotic system, additional amounts of the structural adhesive along the first one of the multiple layers corresponding to planned locations of a second one of the multiple layers of the second heat exchange substructure;
placing, by way of the robot, the second one of the multiple layers of the second heat exchange substructure atop the first one of the multiple layers of the second heat exchange substructure; and
securing the second heat exchange substructure within the display assembly such that a first heat exchange substructure formed, at least in part, by said first panel, said second panel, and said corrugated layer as well as one of the first and second ones of the multiple layers of the second heat exchange substructure form part of an open loop airflow pathway for ambient air when placed in a housing of said display assembly located rearward of an electronic display surface secured within said housing.

17. The display assembly created by the process of claim 16 wherein:
the corrugated layer is created by the steps of folding a sheet of metal to form said ridges and said troughs.

* * * * *

UNITED STATES PATENT AND TRADEMARK OFFICE
CERTIFICATE OF CORRECTION

| | | |
|---|---|---|
| PATENT NO. | : 12,436,422 B2 | Page 1 of 1 |
| APPLICATION NO. | : 18/970066 | |
| DATED | : October 7, 2025 | |
| INVENTOR(S) | : William Dunn et al. | |

It is certified that error appears in the above-identified patent and that said Letters Patent is hereby corrected as shown below:

In the Specification

In Column 1, Line 11, please delete "rested" and insert -- restated --.

Figure 5A:
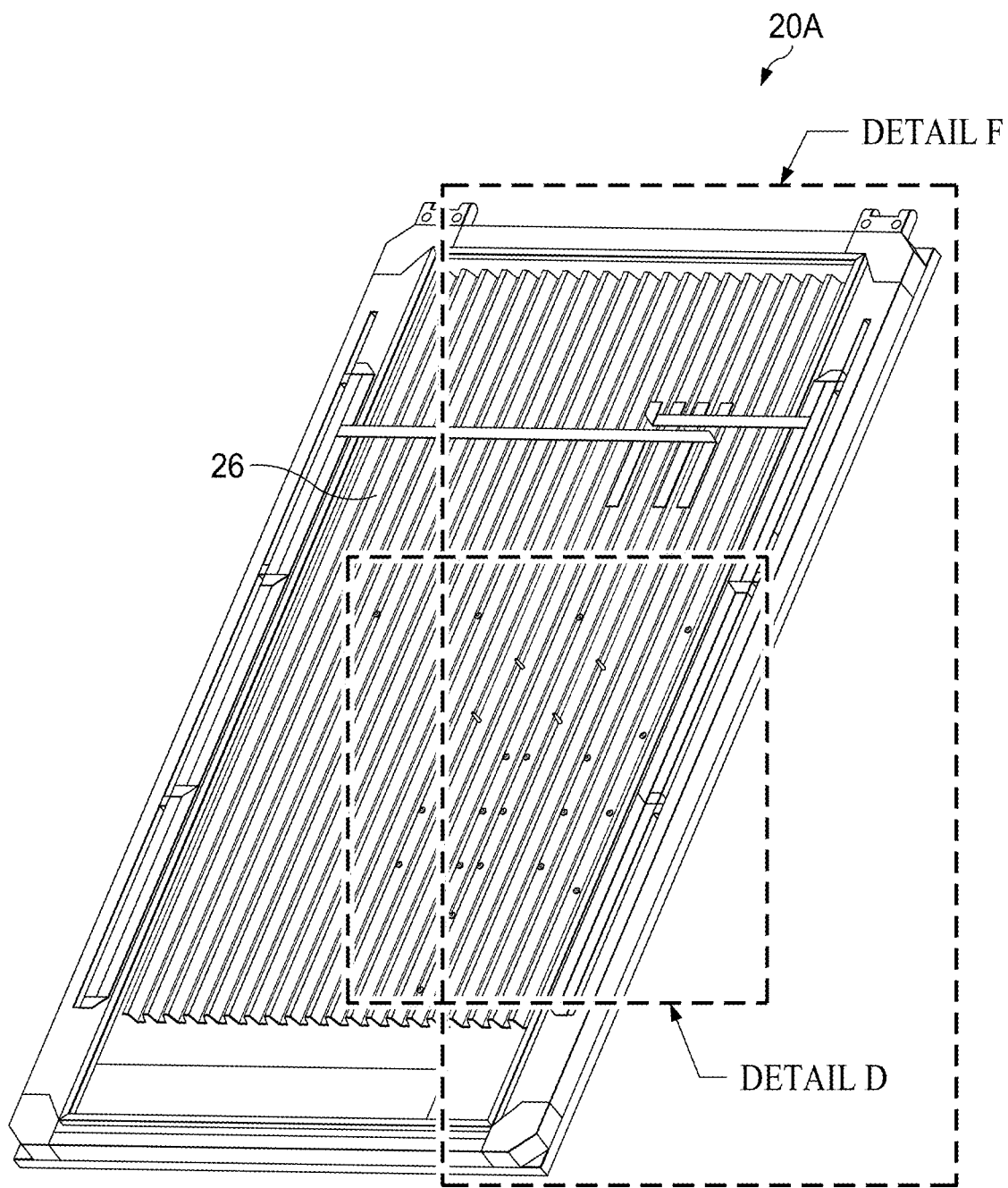
FIG. 5A is a perspective view of a first heat exchange substructure using fasteners for use with the display assembly of FIG. 1 also indicating details D and F, as well as section line B-B.
Figure 5B:
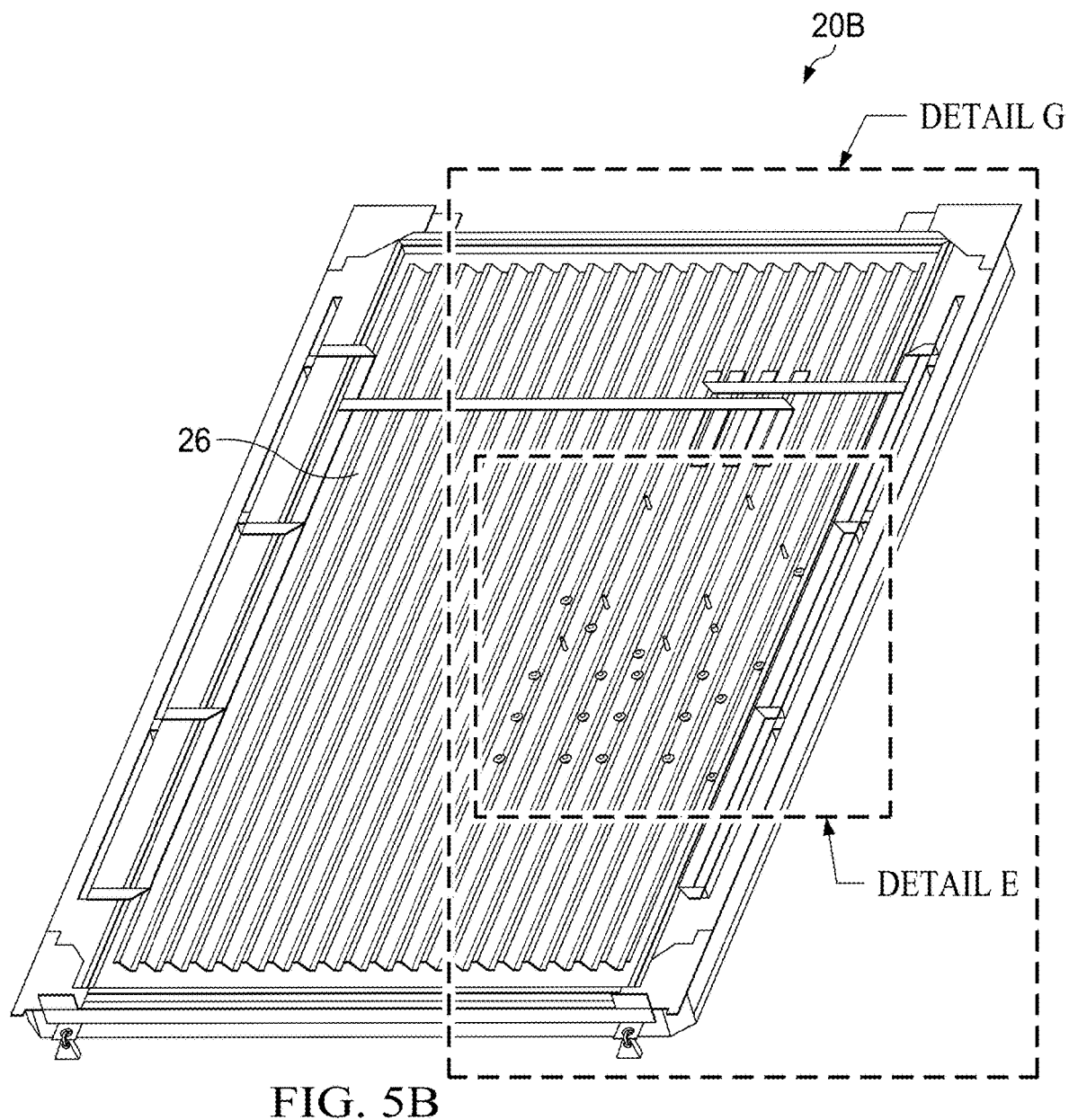
FIG. 5B is a perspective view of a first heat exchange substructure using structural adhesive for use with the display assembly of FIG. 1 also indicating details E and G, as well as section line C-C.
Figure 6A:
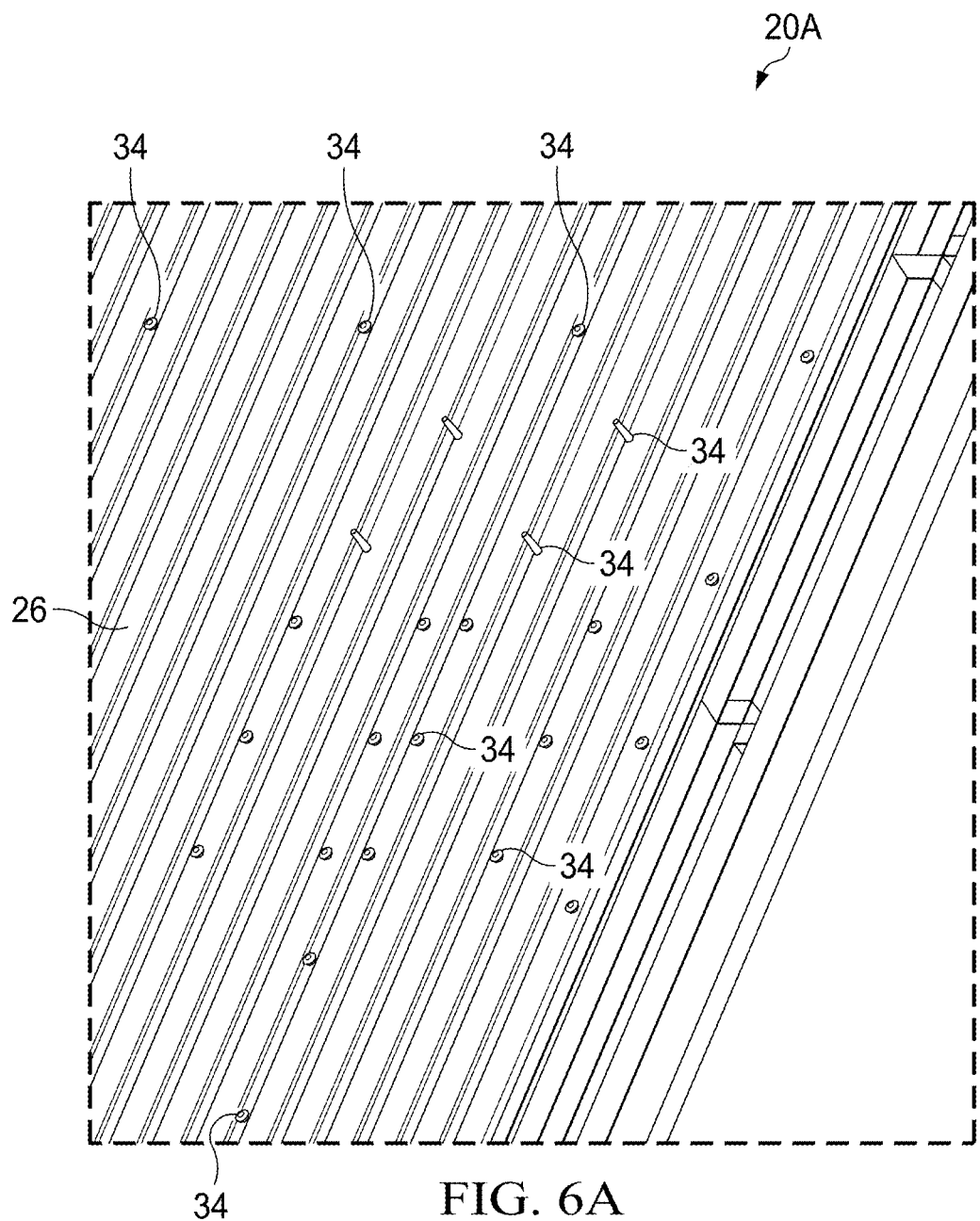
FIG. 6A is a detailed perspective view of detail D of FIG. 5A.
Figure 6B:
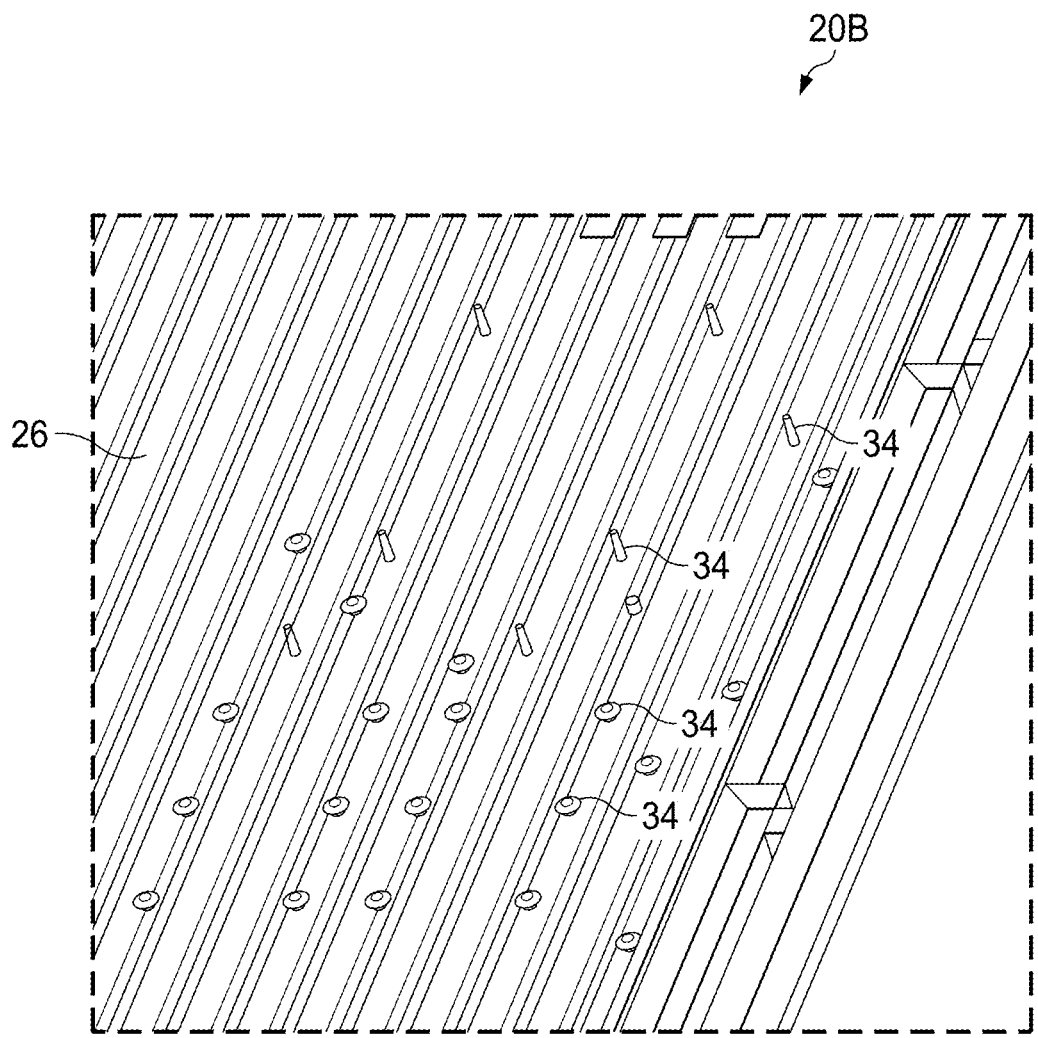
FIG. 6B is a detailed perspective view of detail E of FIG. 5B.
Figure 7A:
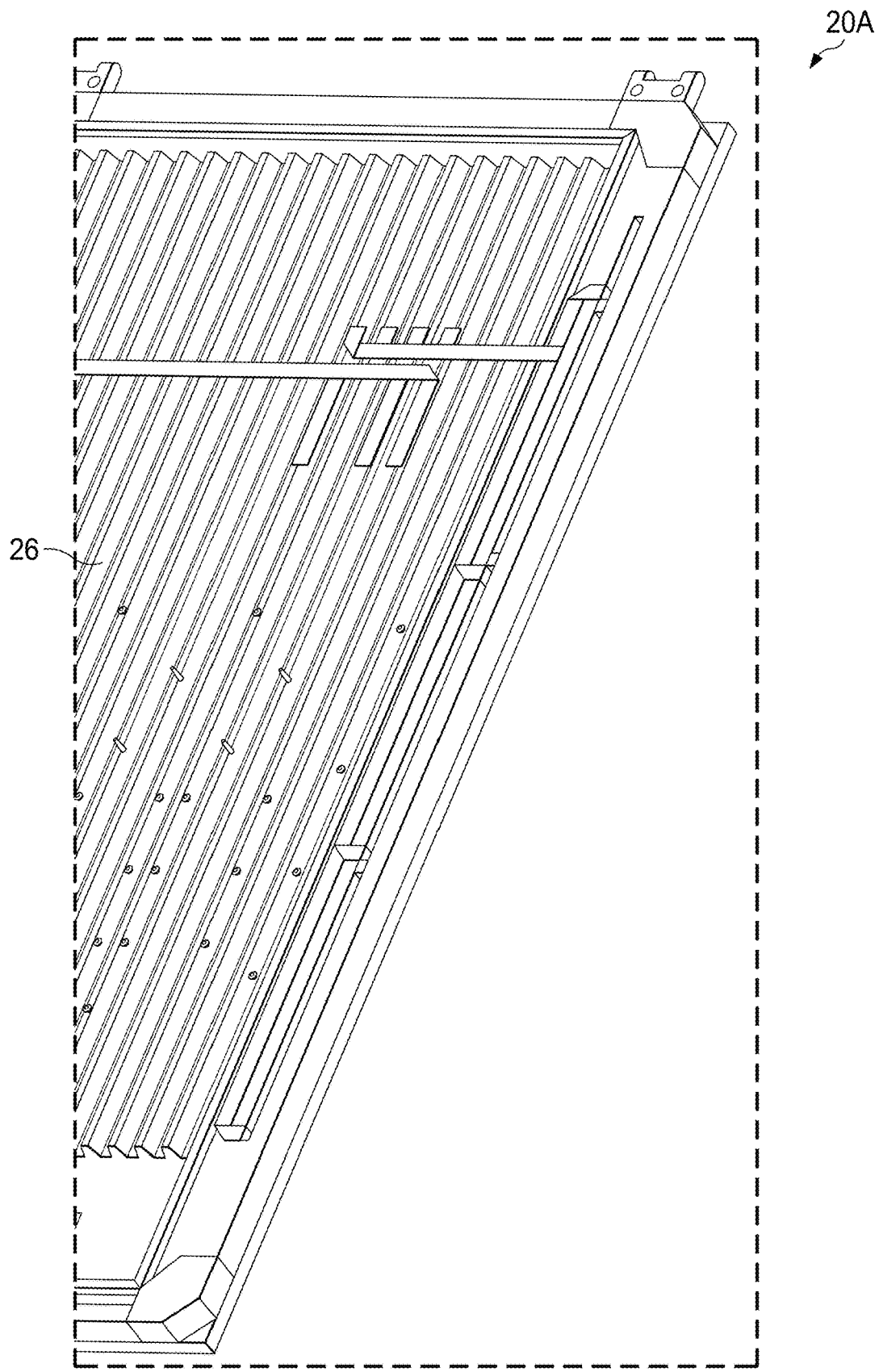
FIG. 7A is another detailed perspective view of detail F of FIG. 5A.
Figure 7B:
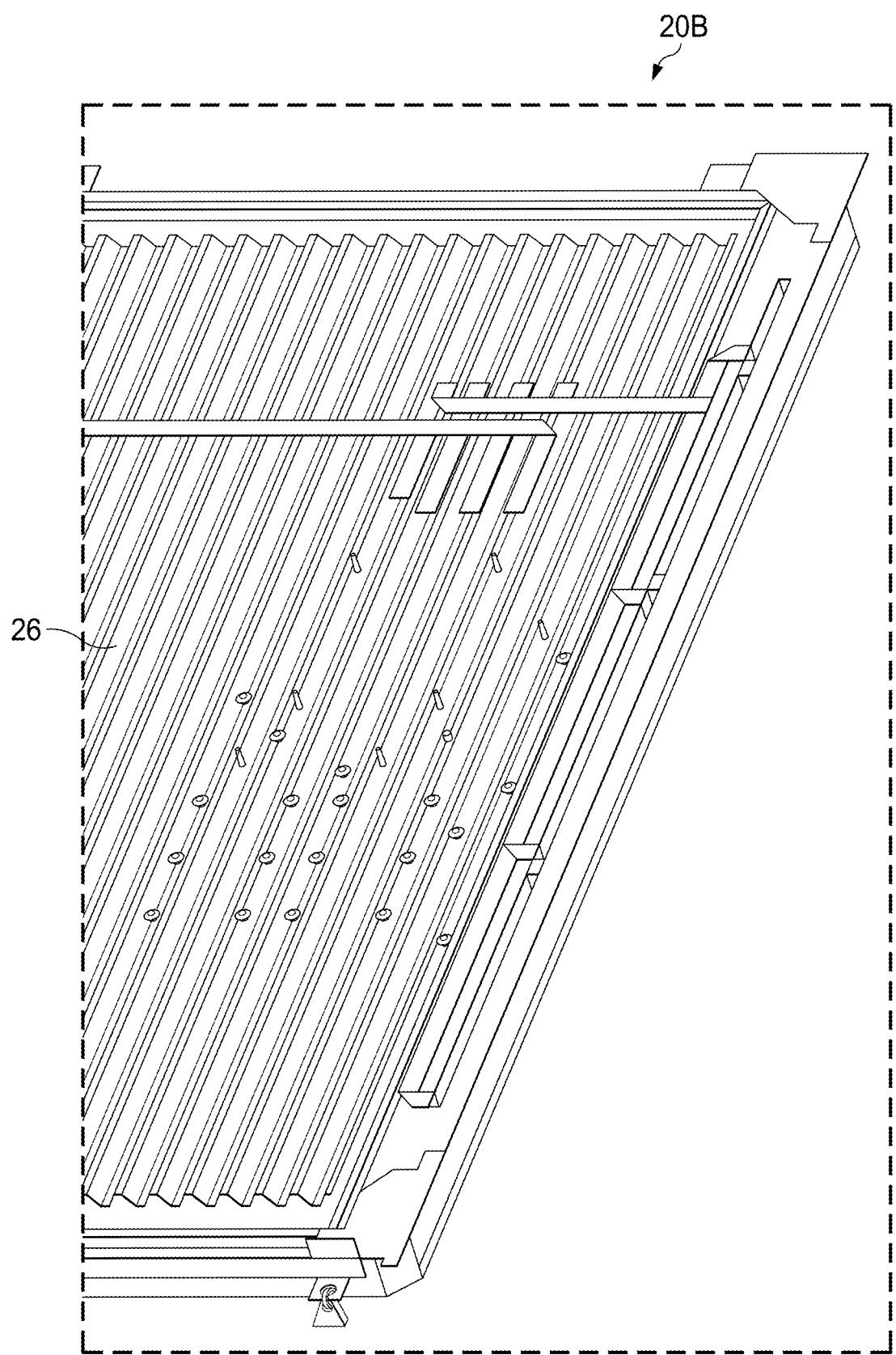
FIG. 7B is another detailed perspective view of detail G of FIG. 5B.
Figure 8A:
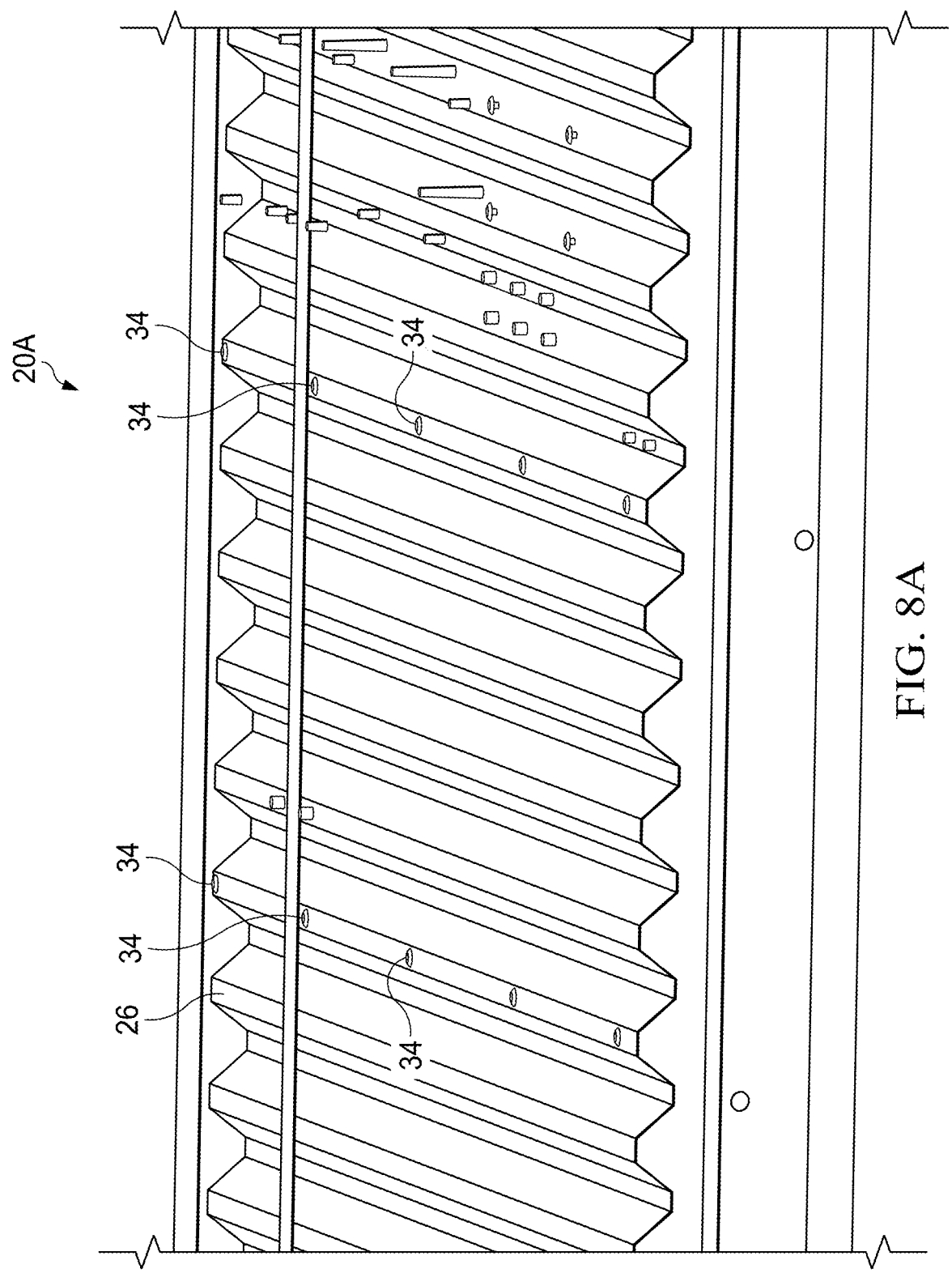
FIG. 8A is a cross sectional perspective view taken along section line B-B of FIG. 5A.

In Column 3, Lines 61-64, please delete "FIG. 8A is a cross sectional perspective view taken along section line B-B of FIG. 5A;
FIG. 8B is a cross sectional perspective view taken along section line C-C of FIG. 5B;" and insert
-- FIGURE 8A is a detailed, end perspective view of figure 5A;
FIGURE 8B is a detailed, end perspective view of figure 5B; --.

In Column 8, Line 25, please delete "adopt" and insert -- atop --.

Signed and Sealed this
Eighteenth Day of November, 2025

John A. Squires
*Director of the United States Patent and Trademark Office*